United States Patent
Koshiba et al.

(10) Patent No.: US 6,183,889 B1
(45) Date of Patent: Feb. 6, 2001

(54) MAGNETO-IMPEDANCE ELEMENT, AND MAGNETIC HEAD, THIN FILM MAGNETIC HEAD, AZIMUTH SENSOR AND AUTOCANCELER USING THE SAME

(75) Inventors: Hisato Koshiba, Miyagi-ken; Takao Mizushima; Akihoro Makino, both of Niigata-ken; Yoshihiro Sudo, Miyagi-ken; Shinichi Sasagawa, Miyagi-ken; Yuichi Shonai, Miyagi-ken; Akihisa Inoue, 11-806 Kawauchijutaku, 35 Mohohasekura, Kawauchi, Aoba-ku, Sendai, Miyagi-ken, all of (JP)

(73) Assignees: Alps Electric Co., Ltd., Tokyo (JP); Akihisa Inoue, Miyagi (JP)

( * ) Notice: Under 35 U.S.C. 154(b), the term of this patent shall be extended for 0 days.

(21) Appl. No.: 09/141,679

(22) Filed: Aug. 27, 1998

(30) Foreign Application Priority Data

| Aug. 28, 1997 | (JP) | 9-233066 |
| Aug. 28, 1997 | (JP) | 9-233067 |
| Aug. 29, 1997 | (JP) | 9-235279 |
| Aug. 29, 1997 | (JP) | 9-235280 |
| Aug. 29, 1997 | (JP) | 9-235284 |
| Dec. 4, 1997 | (JP) | 9-334595 |

(51) Int. Cl.$^7$ ............................. G11B 5/66
(52) U.S. Cl. ............. 428/692; 428/694 T; 428/694 TN; 428/694 R; 428/900; 360/113; 360/114; 360/126; 148/304; 148/403
(58) Field of Search .............. 428/694 T, 694 TN, 428/900, 692, 694 R; 148/304, 403; 360/113, 114, 126

(56) References Cited

U.S. PATENT DOCUMENTS 5,738,733 * 4/1998 Inoue ................... 148/304

FOREIGN PATENT DOCUMENTS

| 0 747 498 A1 | 6/1996 | (EP) . |
| 6216212 | 9/1994 | (JP) . |
| 8330645 | 6/1995 | (JP) . |
| 7181239 | 7/1995 | (JP) . |
| 875835 | 3/1996 | (JP) . |
| 8184656 | 7/1996 | (JP) . |
| 8288568 | 11/1996 | (JP) . |
| 8330645 | 12/1996 | (JP) . |
| 9080134 | 3/1997 | (JP) . |

OTHER PUBLICATIONS

K. Mohri et al.: "Magneto–Impedance Element" IEEE Transactions on Magnetics, US, IEEE, Inc., New York, vol. 31, No. 4, pp. 2455–2460, Jul. 1995.

(List continued on next page.)

*Primary Examiner*—Leszek Kiliman
(74) *Attorney, Agent, or Firm*—Brinks Hofer Gilson & Lione

(57) ABSTRACT

A magneto-impedance element, showing a change in impedance in response to an external magnetic field when an alternating current is applied, is composed of a glassy alloy. The glassy alloy is composed of at least one base metal selected from the group consisting of Fe, Co and Ni; at least one additional metal selected from the group consisting of Zr, Nb, Ta, Hf, Mo, Ti and V; and B. The glassy alloy has a temperature region $\Delta T_x$, of the supercooling liquid zone of 20° C. or more which is represented by the equation $\Delta T_x = T_x - T_g$ wherein $T_x$ is the crystallization temperature and $T_g$ is the glass transition temperature. A magnetic head, a thin film magnetic head, an azimuth sensor and an autocanceler are provided with the MI element.

70 Claims, 25 Drawing Sheets

OTHER PUBLICATIONS

A. Inoue et al.: "Bulk amorphous alloys with high mechanical strength and good soft magnetic properties in Fe–TM–B (TM=IV–VIII group transition metal) system" Applied Physics Letters, US, American Institute of Physics, New York, vol. 71, No. 4, pp. 465–466, May 1997.

K. Hika et al.: "Magneto–Impedence in Sandwich Film for Magnetic Sensor Heads" IEEE Transactions on Magnetics, US, IEEE, Inc., New York, vol. 32, No. 5, pp. 4594–4596, Sep. 1996.

* cited by examiner

MAGNETO-IMPEDANCE ELEMENT, AND MAGNETIC HEAD, THIN FILM MAGNETIC HEAD, AZIMUTH SENSOR AND AUTOCANCELER USING THE SAME

BACKGROUND OF THE INVENTION

1. Field of the Invention

The present invention relates to a magneto-impedance element comprising a glassy alloy which is composed of at least one base metal selected from the group consisting of Fe, Co and Ni; at least one additional metal selected from the group consisting of Zr, Nb, Ta, Hf, Mo, Ti and V; and B.

The present invention also relates to a magnetic head having the magneto-impedance element.

The present invention further relates to a thin film magnetic head comprising an upper core and a lower core which have the magneto-impedance element.

The present invention also relates to an azimuth sensor having the magneto-impedance element.

The present invention further relates to an atutocanceler having a magnetic sensor composed of the magneto-impedance element.

2. Description of the Related Art

With rapid progress in development of information devices, gauging devices, and control devices, magneto-detective elements, which have a smaller size, higher sensitivity and more rapid response than conventional magnetic-flux type elements, have been required. Elements having a magneto-impedance effect, i.e., magneto-impedance elements (hereinafter referred to as MI elements) have attracted attention.

The magneto-impedance effect indicates a phenomenon causing a change in impedance in, for example, a closed circuit as shown in FIG. 5. When an alternating current Iac having a MHz band is applied to a wire or ribbon magnetic material Mi through an electrical power source Eac while an external magnetic field Hex of several gausses is applied in the longitudinal direction of the magnetic material Mi, a voltage Emi by an impedance inherent in the magnetic material occurs between two ends of the magnetic material Mi, and its amplitude varies within a range of several tens percent in response to the intensity of the external magnetic field Hex. Since the MI element is sensitive to an external magnetic field in the longitudinal direction of the element, the sensitivity for detecting a magnetic field does not deteriorate when the length of the sensor head is 1 mm or less. The MI element enables fabrication of a very weak magnetic field sensor having a high resolution of $10^{-5}$ Oe or more and excitation at several MHz or more, hence a high-frequency magnetic field of 200 MHz to 300 MHz can be used as a carrier for frequency modulation, and thus the cutoff frequency of the magnetic field sensor can be easily set to 10 MHz or more. Accordingly, the MI element is expected to be used in novel ultra-compact magnetic heads and sensors for very weak magnetic fields.

Known materials having MI effects include, for example, (1) amorphous ribbons of Fe—Si—B type alloys, e.g. $Fe_{78}Si_9B_{13}$, and (2) amorphous wires of Fe—Co—Si—B system alloys, e.g. $(Fe_6Co_{94})_{72.5}Si_{12.5}B_{15}$ (Kaneo Mouri et al., "Magneto-Impedance (MI) Elements", Papers of Technical Meeting on Magnetics, MAG-94 (1994), Vol. 1, No. 75–84, pp. 27–36, IEE JAPAN).

The Fe—Si—B system and Fe—Co—Si—B system alloys have problems when they are used as MI elements. As shown in FIG. 6, when an output voltage Emi (mV) to a positive or negative magnetic field is measured, the Fe—Si—B system alloy i has low sensitivity for detecting the magnetic field, and thus a high amplitude of about 100 times is required. The element, therefore, cannot be used as a magnetic field sensor with a high sensitivity because of noise generation. On the other hand, although the Fe—Co—Si—B system alloy ii has a sufficiently high sensitivity, as shown in FIG. 6, it has a steep increase in the sensitivity within a range from −2 Oe to +2 Oe. As a result, it cannot be used as a sensing element for a very weak magnetic field due to non-quantitative measurement within the range. Although it can be used in magnetic field regions of 2 Oe or more as the absolute value, a coil must be provided to apply a considerable amount of current which is required for such a large bias magnetic field.

Recently, further miniaturization and further improvement in recording density have been required in magnetic recording units, such as hard disk drives as external memory units, digital audio tape recorders, and digital video tape recorders. Development of high performance magnetic heads is essential for such requirements, and magnetic reproduction heads using magnetoresistive elements (hereinafter referred to as MR elements) have been developed.

Since a magnetic head having a MR element does not have a dependence of a relative velocity to the recording medium, it is suitable for reading recorded signals at a low relative velocity. It has a low sensitivity to output signals because of a low change rate in response to a change in the recorded magnetization on the recording medium. Accordingly, it will be difficult to satisfy future demands for high-density recording.

Under the above-mentioned circumstances, MI elements have recently attracted attention. As described above, conventional MR elements have a magneto-detective sensitivity of about 0.1 Oe, whereas the MI elements having magneto-impedance effects can detect a magnetization of $10^{-5}$ Oe and are expected to be applied to high-sensitivity magnetic heads.

A typical conventional magnetic sensor of a magnetic head using the MI element will now be described with reference to the drawings. In FIGS. 28A and 28B, a magnetic head 201 has a pair of cores 202a and 202b composed of ferrite as a ferromagnetic oxide, and a MI element 205 as a magnetic material which is bonded to the cores 202a and 202b with a bonding glass 203 interposed therebetween. The MI element 205 is magnetically coupled with the cores 202a and 202b. That is, the ends 205a and 205b in the longitudinal direction of the MI element 205 are bonded to the magnetic circuit connecting faces 203a and 203b of the cores 202a and 202b, respectively. An insulating layer is formed on the magnetic circuit connecting faces 203a and 203b. The cores 202a and 202b and the MI element 205 thereby form a closed magnetic circuit.

The bonding glass 203 is composed of a nonmagnetic material, prevents direct magnetic coupling between the paired cores 202a and 202b, and is bonded to the lower faces of the cores 202a and 202b. A magnetic gap G is provided between the cores 202a and 202b. A regulating groove 204 is provided on the magnetic gap G for regulating the track width of the magnetic gap G, and filled with glass which is a nonmagnetic material. Conductive films composed of Cu, Au, or the like is deposited to form terminals 206a and 206b on the two ends of the MI element 205 in the longitudinal direction. The terminals 206a and 206b are each connected to a lead 207 for extracting output signals and a lead (not shown in the drawings) for applying an alternating current.

The magnetic head 201 operates as follows. An external magnetic field by the recorded magnetization on a recording medium not shown in the drawing invades the cores 202a and 202b through the magnetic gap G and is applied to the MI element 205. An alternating current having a MHz band has been previously applied to the MI element 205 to generate a voltage between both ends of the MI element 205 by the impedance inherent in the MI element. The amplitude of the voltage varies within a range of several tens percent in response to the intensity of the external magnetic field and is extracted as output signals through the lead 207.

The magnetic head 201 using the MI element 205 has a significantly high change in the extracted voltage for a very weak external magnetic field of several gausses which is applied to the MI element 205 from the recording medium, hence the magnetic head 201 can have high sensitivity. Further, such high sensitivity permits reduction in the effective cross-sectional area of the magnetic flux in the magnetic circuit, and thus reduction in the size of the cores 202a and 202b, resulting in miniaturization of the magnetic head 201.

Conventional materials used for MI elements are amorphous ribbons composed of Fe—Si—B system alloys, e.g. $Fe_{78}Si_9B_{13}$ and amorphous wires composed of Fe—Co—Si—B system alloys, e.g. $(Fe_6Co_{94})_{72.5}Si_{12.5}B_{15}$. A magnetic head 201 using a MI element 205 composed of the $Fe_{78}Si_9B_{13}$ alloy, however, produce a low output voltage from the MI element 205 for the applied external magnetic field. Thus, the output signals must be amplified by about 100 times. The element, therefore, cannot produce high quality output signals because of noise generation during the amplification.

On the other hand, a magnetic head 201 using a MI element 205 composed of the $(Fe_6Co_{94})_{72.5}Si_{12.5}B_{15}$ alloy produces a high voltage from the MI element 205 for the applied external magnetic field, resulting in a low amplification of the output signals. The output voltage, however, steeply and nonquantitatively varies within the very weak external magnetic field range from −2 Oe to +2 Oe. As a result, the MR element cannot be used as a magnetic field detecting element of the magnetic head. Although it can be used in a magnetic field region of 2 Oe or more as the absolute value, a coil must be provided to apply a considerable amount of current which is required for such a large bias magnetic field. When the bias magnetic field is applied from a permanent magnet having a magnetization of about 2 Oe, a complicated configuration of the magnetic head 201 is unavoidable.

In the $Fe_{78}Si_9B_{13}$ and $(Fe_6Co_{94})_{72.5}Si_{12.5}B_{15}$ alloys, since a temperature region $\Delta T_x$ of the supercooling liquid is narrow, these must be quenched at a cooling rate of $10^{5°}$ C./second by a single roll process to form amorphous alloys. Thus, only a thin ribbon having a thickness of 50 $\mu$m or less is obtainable. Fine working is necessary if these alloys are used for magnetic heads, resulting in increased production costs of the magnetic heads.

The present inventors have developed various types of alloys. One of them is a glassy alloy. Some multi-element alloys are known as glassy alloys having a wide temperature region in the supercooling liquid before crystallization. It is also known that glassy alloys can be obtained as a bulk having a thickness which is significantly larger than that of a thin ribbon of the amorphous alloy produced by a known liquid quenching process. Known glassy alloys have the following compositions, for example, Ln—Al—TM, Mg—Ln—TM, Zr—Al—TM, Hf—Al—Tm, and Ti—Zr—Be—TM, wherein Ln represents a rare earth element and TM represents a transfer metal.

Although these glassy alloys show a supercooling liquid state, the temperature region $\Delta T_x$, that is, the difference $(T_x-T_g)$ between the crystallization temperature $(T_x)$ and the glass transition temperature $(T_g)$ is small. Thus, these alloys have poor formability of glassy alloys which is insufficient for practical use. An alloy having a wide temperature region of the supercooling liquid state and enabling the formation of a glassy alloy by cooling metallurgically attracts considerable attention, since it can overcome the restriction regarding the thickness in conventional amorphous alloy ribbons. An alloy having a large difference $\Delta T_x$ enables a wide variety of deposition conditions in alloy thin film production processes, such as sputtering, and thus has industrial advantages. The alloy must, however, have ferromagnetic characteristics at room temperature before industrial use.

No glassy alloys having ferromagnetic characteristics at room temperature, however, have been known, hence their industrial application as magnetic materials has been limited. Accordingly, development of glassy alloys having ferromagnetic characteristics at room temperature and capable of forming a thick bulk has been in progress.

Azimuth sensors can measure the direction of the magnetic flux of an external magnetic field such as geomagnetism, and have been widely used as sensors for vehicle compasses and navigation systems which detect the location of vehicles.

Among the azimuth sensors, since a flux gate sensor shows excellent stability according to its operational principle and a high sensitivity of $10^{-7}$ to $10^{-6}$ G, it has been widely used. The flux gate sensor includes a cyclic magnetic core, an exciting coil coiled around the magnetic core for applying a magnetic field, and a sensing coil for detecting the magnetic flux density of the magnetic core. Thus, it has a bulky shape and is miniaturized with great difficulty.

Another azimuth sensor uses two MR elements. These MR elements are arranged in a common plane so that paths of the currents applied to these MR elements are perpendicular to each other and connected to a bridge to detect the direction of the magnetic flux of an external magnetic field. The azimuth sensor has a simplified shape and will be easily miniaturized.

An azimuth sensor using conventional MR elements, however, has a small rate of change in inherent resistance of 3% to 6% to the intensity of the external magnetic field. Such a nonsensitive change is unsuitable for accurate measurement of a magnetic flux of an external magnetic field such as geomagnetism and thus an azimuth sensor.

As a result of the trend towards high definition of CAD image information, the pitch of shadow mask holes in a display having a CRT tube (hereinafter referred to as a CRT display) has become finer. For example, a CRT display having a screen size of 14 inches has a pitch of 0.28 mm/mask. In such a high definition screen, electron beams in the CRT tube deviate from the objective lines by the effect of an external magnetic field such as geomagnetism, resulting in deterioration of image quality, e.g. distorted images, and uneven colors. Current CRT displays, therefore, have autocancelers for canceling the effect of the geomagnetism. The autocanceler has a canceling coil for applying a magnetic field having the reverse vector to the magnetic field of the geomagnetism, that is, a canceling magnetic field to the CRT tube, and a controller for controlling the vector of the canceling magnetic field.

A typical conventional controller for the autocanceler has a flux gate magnetic sensor having excellent stability according to its operational principle and a high sensitivity of $10^{-7}$ to $10^{-6}$ G. The flux gate sensor includes a cyclic magnetic core, an exciting coil coiled around the magnetic core for applying a magnetic field, and a sensing coil for detecting the magnetic flux density of the magnetic core. Thus, it has a bulky shape and is miniaturized with great difficulty.

Another magnetic sensor for the autocanceler uses two MR elements. These MR elements are arranged in a common plane so that paths of the currents applied to these MR elements are perpendicular to each other and connected to a bridge to detect the direction of the magnetic flux of an external magnetic field. The autocanceler has a simplified shape and will be easily miniaturized.

A magnetic sensor using conventional MR elements, however, has a small rate of change in inherent resistance of 3% to 6% to the intensity of the external magnetic field. Such a nonsensitive change is unsuitable for accurate measurement of a magnetic flux of an external magnetic field such as geomagnetism. Thus, the vector of the canceling magnetic field for normally operating the autocanceler cannot be optimized.

SUMMARY OF THE INVENTION

It is an object of the present invention to provide a MI element having excellent characteristics as a magnetic sensing element.

It is another object of the present invention to provide a magnetic head which generates high-quality output signals, has a simplified configuration and can be manufactured with low production costs.

It is still another object of the present invention to provide a thin film magnetic head, for detecting an external magnetic field, having a thin film MI element composed of a glassy alloy which has ferromagnetic characteristics at room temperature and high permeability.

It is a further object of the present invention to provide an azimuth sensor which can be miniaturized and can accurately determine the direction of the magnetic flux of geomagnetism.

It is a still further object of the present invention to provide an autocanceler having a magnetic sensor which can be miniaturized and can accurately determine the direction of the magnetic flux of geomagnetism.

A first aspect of the present invention is a magneto-impedance element, showing a change in impedance in response to an external magnetic field when an alternating current is applied, comprising a glassy alloy comprising at least one base metal selected from the group consisting of Fe, Co and Ni; at least one additional metal selected from the group consisting of Zr, Nb, Ta, Hf, Mo, Ti and V; and B; and having a temperature region ΔTx of the supercooling liquid zone of 20° C. or more, the temperature region being represented by the equation $\Delta T_x = T_x - T_g$ wherein $T_x$ is the crystallization temperature and $T_g$ is the glass transition temperature.

Preferably, the glassy alloy has a composition represented by the following formula and a $\Delta T_x$ of 50° C. or more:

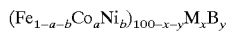

wherein $0 \leq a \leq 0.29$, $0 \leq b \leq 0.43$, 5 atomic percent$\leq x \leq$20 atomic percent, 10 atomic percent$\leq y \leq$22 atomic percent, and M is at least one metal selected from the group consisting of Zr, Nb, Ta, Hf, Mo, Ti and V. More preferably, the $\Delta T_x$ is 60° C. or more, and suffixes a and b satisfy $0.042 \leq a \leq 0.29$ and $0.042 \leq b \leq 0.43$, respectively.

Preferably, the glassy alloy has a composition represented by the following formula and a $\Delta T_x$ of 50° C. or more:

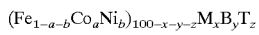

wherein M is at least one additional metal selected from the group consisting of Zr, Nb, Ta, Hf, Mo, Ti and V; T is at least one additional element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent$\leq x \leq$20 atomic percent, 10 atomic percent$\leq y \leq$22 atomic percent, and 0 atomic percent$\leq z \leq$5 atomic percent. More preferably, the $\Delta T_x$ is 60° C. or more, and suffixes a and b satisfy $0.042 \leq a \leq 0.29$ and $0.042 \leq b \leq 0.43$, respectively.

Preferably, the glassy alloy is subjected to heat treatment involving cooling after heating at 427° C. to 627° C.

A second aspect of the present invention is a magnetic head comprising a magneto-impedance element. The magneto-impedance element comprises a soft magnetic glassy alloy composed of at least one primary component selected from the group consisting of Fe, Co and Ni; at least one component selected from the group consisting of Zr, Nb, Ta, Hf, Mo, Ti and V; and B; and having a temperature region ΔTx of the supercooling liquid zone of 20° C. or more, the temperature region being represented by the equation $\Delta T_x = T_x - T_g$ wherein $T_x$ is the crystallization temperature and $T_g$ is the glass transition temperature.

Preferably, the magnetic glassy alloy has a composition represented by the following formula and a $\Delta T_x$ of 50° C. or more:

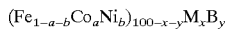

wherein $0 \leq a \leq 0.29$, $0 \leq b \leq 0.43$, 5 atomic percent$\leq x \leq$20 atomic percent, 10 atomic percent$\leq y \leq$22 atomic percent, and M is at least one element selected from the group consisting of Zr, Nb, Ta, Hf, Mo, Ti and V. More preferably, the $\Delta T_x$ is 60° C. or more, and suffixes a and b satisfy $0.042 \leq a \leq 0.29$ and $0.042 \leq b \leq 0.43$, respectively.

Preferably, the soft magnetic glassy alloy has a composition represented by the following formula and a $\Delta T_x$ of 50° C. or more:

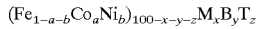

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent$\leq x \leq$20 atomic percent, 10 atomic percent$\leq y \leq$22 atomic percent, and 0 atomic percent$\leq z \leq$5 atomic percent. More preferably, the $\Delta T_x$ is 60° C. or more, and suffixes a and b satisfy $0.042 \leq a \leq 0.29$ and $0.042 \leq b \leq 0.43$, respectively.

The magnetic head further may comprise a pair of cores and a bonding glass bonding one face of each of the cores by being interposed between the cores; wherein the magneto-impedance element is arranged over the cores so that an external magnetic field is applied to the magneto-impedance element through the cores. Preferably these cores are composed of ferrite. Preferably, a coil groove is provided between an end and the other end of each of said pair of cores and a recording coil is wound around the coil groove.

Preferably, the magneto-impedance element is provided with a biasing means. Preferably, the biasing means is a biasing coil wound around the coil groove. Alternatively, the biasing means may be a permanent magnet provided at the end of the magneto-impedance element.

A third aspect of the present invention is a thin film magnetic head comprising a thin film magneto-impedance element, provided for detecting an external magnetic field and showing a change in impedance in response to the external magnetic field when an alternating current is applied. The thin film magneto-impedance element comprises a glassy alloy having a temperature region $\Delta T_x$ of the supercooling liquid zone of 20° C. or more, the temperature region being represented by the equation $\Delta T_x = T_x - T_g$ wherein $T_x$ is the crystallization temperature and $T_g$ is the glass transition temperature. The glassy alloy composed of at least one primary component selected from the group consisting of Fe, Co and Ni; at least one component selected from the group consisting of Zr, Nb, Ta, Hf, Mo, Ti and V; and B.

Preferably, the glassy alloy has a composition represented by the following formula and a $\Delta T_x$ of 50° C. or more:

$$(Fe_{1-a-b}Co_aNi_b)_{100-x-y}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one metal selected from the group consisting of Zr, Nb, Ta, Hf, Mo, Ti and V. Preferably, the $\Delta T_x$ is 60° C. or more, and suffixes a and b satisfy $0.042 \leq a \leq 0.29$ and $0.042 \leq b \leq 0.43$, respectively.

Preferably, the glassy alloy has a composition represented by the following formula and a $\Delta T_x$ of 50° C. or more:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one additional element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent. Preferably, the $\Delta T_x$ is 60° C. or more, and suffixes a and b satisfy $0.042 \leq a \leq 0.29$ and $0.042 \leq b \leq 0.43$, respectively.

Preferably, the thin film magnetic head has a magnetic induction-type structure comprising a writing head and a reading head provided on a slider in which its medium-facing side moves relative to a magnetic medium. The writing head has a magnetic gap and a coil lead interposed between a thin film upper core and a thin film lower core, and the reading head has a magneto-impedance element and an electrode film connected to the magneto-impedance element.

Preferably, the thin film magneto-impedance element has a biasing means. Preferably, the biasing means is a permanent magnet connected to the thin film magneto-impedance element. Alternatively, the biasing means may be a ferromagnetic thin film deposited on said thin film magneto-impedance element, and an antiferromagnetic thin film deposited on the ferromagnetic thin film, and the bias is applied by an exchange coupling magnetic field induced in the ferromagnetic thin film by said antiferromagnetic thin film.

A fourth aspect of the present invention is an azimuth sensor comprising a magneto-impedance element as a sensing means of the direction of a magnetic flux of an external magnetic field. The magneto-impedance element comprises a soft magnetic glassy alloy composed of at least one primary component selected from the group consisting of Fe, Co and Ni; at least one additional metal selected from the group consisting of Zr, Nb, Ta, Hf, Mo, Ti and V; and B; and having a temperature region $\Delta Tx$ of the supercooling liquid zone of 20° C. or more, the temperature region being represented by the equation $\Delta T_x = T_x - T_g$ wherein $T_x$ is the crystallization temperature and $T_g$ is the glass transition temperature.

Preferably, the soft magnetic glassy alloy has a composition represented by the following formula and a $\Delta T_x$ of 50° C. or more:

$$(Fe_{1-a-b}Co_aNi_b)_{100-x-y}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one metal selected from the group consisting of Zr, Nb, Ta, Hf, Mo, Ti and V. Preferably, the $\Delta T_x$ is 60° C. or more, and suffixes a and b satisfy $0.042 \leq a \leq 0.29$ and $0.042 \leq b \leq 0.43$, respectively.

Preferably, the soft magnetic glassy alloy has a composition represented by the following formula and a $\Delta T_x$ of 50° C. or more:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one additional element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent. Preferably, the $\Delta T_x$ is 60° C. or more, and suffixes a and b satisfy $0.042 \leq a \leq 0.29$ and $0.042 \leq b \leq 0.43$, respectively.

Preferably, the azimuth sensor has a first magneto-impedance element as a sensing means of an X-axis component of the magnetic flux of the external magnetic field, and a second magneto-impedance element as a sensing means of a Y-axis component of the magnetic flux.

Preferably, the first and second magneto-impedance elements are arranged in the same plane so that the current paths of alternating currents applied to these elements are perpendicular to each other.

Preferably, a coil for applying a bias magnetization along the current path of the alternating current is wound around each of the first and second magneto-impedance elements.

A fifth aspect of the present invention is an autocanceler comprising a canceling coil for applying a canceling magnetic field having the reverse vector to the magnetic flux of an external magnetic field to a CRT tube, and a control unit for controlling the vector of the canceling magnetic field based on the direction of the magnetic flux of said external magnetic field detected by a magnetic sensor. The magnetic sensor as a sensing means of the external magnetic field comprises a magneto-impedance element comprising a soft magnetic glassy alloy. The soft magnetic glassy alloy comprises at least one primary component selected from the group consisting of Fe, Co and Ni; at least one additional metal selected from the group consisting of Zr, Nb, Ta, Hf, Mo, Ti and V; and B; and has a temperature region $\Delta T_x$ of the supercooling liquid zone of 20° C. or more, the temperature region being represented by the equation $\Delta T_x = T_x - T_g$, wherein $T_x$ is the crystallization temperature and $T_g$ is the glass transition temperature.

Preferably, the soft magnetic glassy alloy has a composition represented by the following formula and a $\Delta T_x$ of 50° C. or more:

$$(Fe_{1-a-b}Co_aNi_b)_{100-x-y}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one metal selected from the group consisting of Zr, Nb, Ta, Hf, Mo, Ti and V. Preferably, the $\Delta T_x$ is 60° C. or more, and suffixes a and b satisfy $0.042 \leq a \leq 0.29$ and $0.042 \leq b \leq 0.43$, respectively.

Preferably, the soft magnetic glassy alloy has a composition represented by the following formula and a $\Delta T_x$ of 50° C. or more:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one additional element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent$\leq x \leq 20$ atomic percent, 10 atomic percent$\leq y \leq 22$ atomic percent, and 0 atomic percent$\leq z \leq 5$ atomic percent. Preferably, the $\Delta T_x$ is 60° C. or more, and suffixes a and b satisfy $0.042 \leq a \leq 0.29$ and $0.042 \leq b \leq 0.43$, respectively.

Preferably, the magnetic sensor comprises: a first magneto-impedance element as a sensing means of an X-axis component of the magnetic flux of the external magnetic field; and a second magneto-impedance element as a sensing means of a Y-axis component of the magnetic flux. Preferably, the first and second magneto-impedance elements are arranged in the same plane so that the current paths of alternating currents applied to these elements are perpendicular to each other.

Preferably, a coil for applying a bias magnetization along the current path of the alternating current is wound around each of the first and second magneto-impedance elements.

DESCRIPTION OF THE PREFERRED EMBODIMENT

Figure 1:
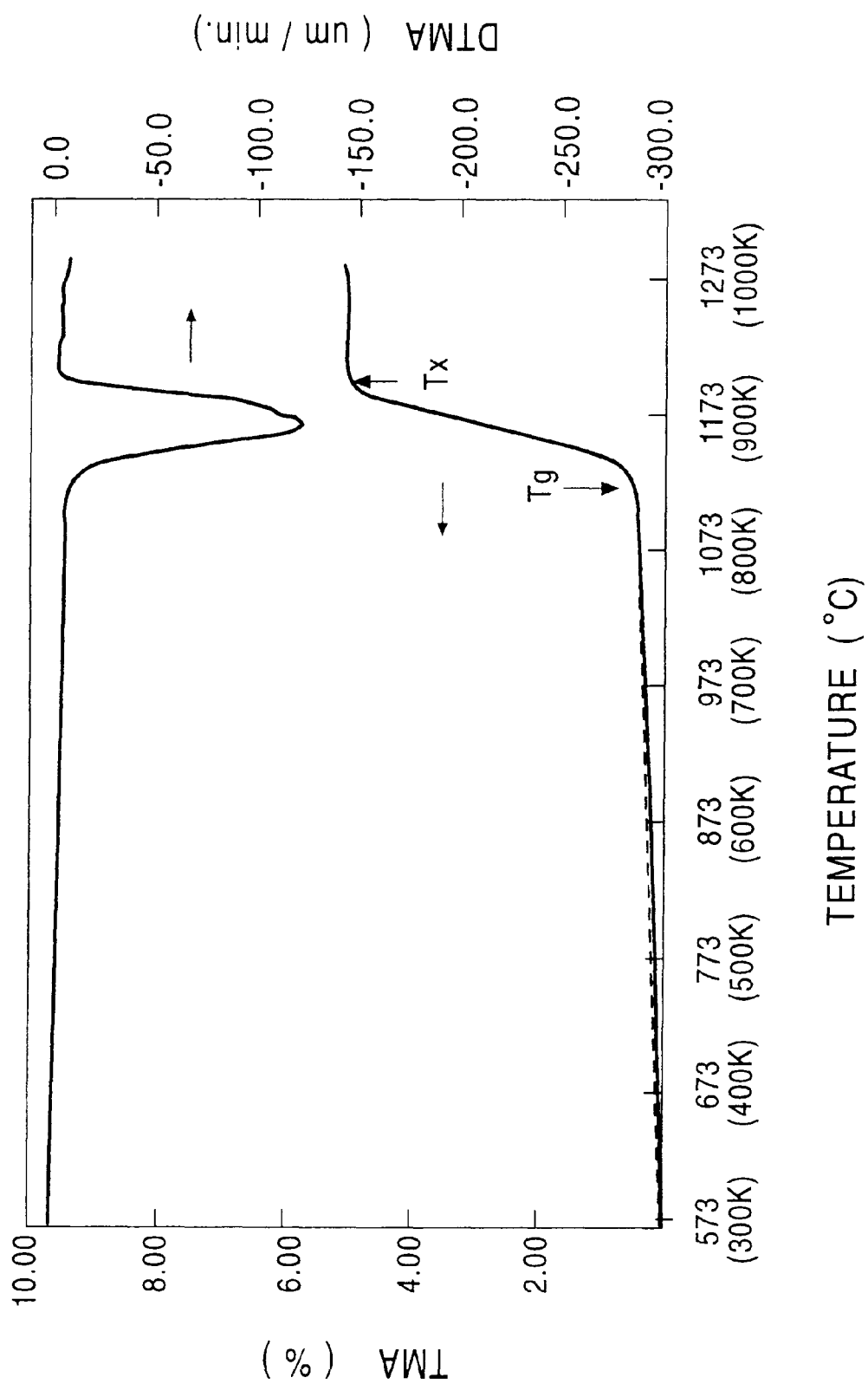
FIG. 1 is a DSC thermogram of a glassy alloy of a MI element in accordance with the present invention.

A glassy alloy constituting a MI element in accordance with the present invention contains the following three essential components.

A. Basic metal: at least one metal selected from the group consisting of Fe, Co and Ni.

B. Additional metal (M): at least one metal selected from the group consisting of Zr, Nb, Ta, Hf, Mo, Ti and V.

C. Boron (B).

The glassy alloy may contain the following optional component.

D. Additional element (T): at least one element selected from the group consisting of Cr, W, Ru, Rh, Pd, Os, Ir, Pt, Al, Si, Ge, C and P.

Accordingly, the composition in accordance with the present invention is represented by the following formula:

$$(Fe_{1-a-b}Co_aNi_b)_{100-x-y}M_xB_y$$

wherein M is at least one element selected from the group consisting of Zr, Nb, Ta, Hf, Mo, Ti and V. The formula preferably satisfies $0 \leq a \leq 0.29$, $0 \leq b \leq 0.43$, 5 atomic percent$\leq x \leq 20$ atomic percent, and 10 atomic percent$\leq y \leq 22$ atomic percent.

It is preferred that the glassy alloy contains Zr as an essential component and the temperature region of the supercooling liquid $\Delta T_x$ ($=T_x-T_g$) be 25° C. or more, wherein $T_x$, and $T_g$ are the crystallization temperature and glass transition temperature, respectively, of the glassy alloy.

It is more preferable that $\Delta T_x$ be 60° C. or more.

The formula $(Fe_{1-a-b}Co_aNi_b)_{100-x-y}M_xB_y$ more preferably satisfies $0.042 \leq a \leq 0.29$, and $0.042 \leq b \leq 0.43$.

The composition of another embodiment of the glassy alloy in accordance with the present invention is represented by the following formula:

$$(Fe_{1-a-b}Co_aNi_b)_{100-x-y-z}M_xB_yT_z$$

wherein M is at least one element selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and the formula satisfies $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent.

The formula $(Fe_{1-a-b}Co_aNi_b)_{100-x-y-z}M_xB_yT_z$ preferably satisfies $0.042 \leq a \leq 0.29$, and $0.042 \leq b \leq 0.43$.

The element M may be represented by the formula $(M'_{1-c}M''_c)$, wherein M' is at least one of the elements Zr and Hf, and M" is at least one element selected from the group consisting of Nb, Ta, Mo, Ti and V.

The formula may satisfy $0.2 \leq c \leq 0.4$, or $0 \leq c \leq 0.2$.

The formula more preferably satisfies $0.042 \leq a \leq 0.25$, and $0.042 \leq b \leq 0.1$.

The glassy alloy in accordance with the present invention may be subjected to heat treatment at 427° C. (700 K) to 627° C. (900 K). The glassy alloy treated within this temperature range has high permeability. Since rapid cooling after the treatment causes precipitation of the crystal phase, it is preferable that the cooling rate after the treatment be as low as possible in order to form an amorphous phase. Thus, slow cooling or annealing of the glassy alloy after the treatment is preferred. In the formula, C may be substituted for 50 atomic percent or less of B.

Grounds of the Limitation of the Composition

In the glassy alloy in accordance with the present invention, a composition containing a larger content of Fe as the main component has a trend towards a larger $\Delta T_x$, and optimized contents of Co and Ni in the composition can achieve a $\Delta T_x$ of 60° C. or higher. It is preferable that the Co content lies within the range of $0 \leq a \leq 0.29$ and the Ni content lies within the range of $0 \leq b \leq 0.43$ to ensure a $\Delta T_x$ of 50° C. to 60° C. It is preferable that the Co content lies within the range of $0.042 \leq a \leq 0.29$ and the Ni content lies within the range of $0.042 \leq b \leq 0.43$ to ensure a $\Delta T_x$ of 60° C. or more.

The Co content preferably lies within the range of $0.042 \leq a \leq 0.25$ in order to achieve excellent magnetic impedance. Also, the Ni content preferably lies within the range of $0.042 \leq b \leq 0.1$ for the same purpose.

M is at least one element selected from the group consisting of Zr, Nb, Ta, Hf, Mo, Ti and V. These elements are effective for the formation of the amorphous phase. The content of the element M is preferably 5 atomic percent or more and 20 atomic percent or less, and more preferably 5 atomic percent or more and 15 atomic percent or less. Among these elements, Zr is particularly effective. Nb can substitute for a part of Zr within a range which satisfies $0 \leq c \leq 0.6$ in order to achieve a higher $\Delta T_x$. The Nb content satisfying $0.2 \leq c \leq 0.4$ can achieve a significantly high $\Delta T_x$ of 80° C. or more.

B (boron) has high formability of the amorphous phase. B is added within a range of 10 atomic percent or more and 22 atomic percent or less in the present invention. A content of B which is less than 10 atomic percent causes extinction of the $\Delta T_x$, whereas a content of B which is higher than 22 atomic percent does not cause the formation of the amorphous phase. A content of B which is 16 atomic percent or more and 20 atomic percent or less causes more satisfactory formation of the amorphous phase and more satisfactory magneto-impedance effects.

The glassy alloy may contain at least one element selected from the group consisting of Cr, W, Ru, Rh, Pd, Os, Ir, Pt, Al, Si, Ge, C and P. These elements can be added within a range of 0 to 5 atomic percent. Although these elements are added for the purpose of improvement in corrosion resistance, the addition over the range causes undesirable deterioration of the formability of the amorphous phase.

Examples of preferred glassy alloys which can be used as MI elements in accordance with the present invention are as follows:

$$Fe_{56}Co_7Ni_7Zr_8Nb_2B_{20} \quad (1)$$

$$Fe_{56}Co_7Ni_7Zr_6Nb_4B_{20} \quad (2)$$

The glassy alloy in accordance with the present invention must have a temperature range of the supercooling liquid $\Delta T_x$ of 20° C. or more and preferably 50° C. or more. For example, the glassy alloy represented by the formula (1) has a crystallization temperature $T_x$ of 910° C., a glass transition temperature $T_g$ of 850° C., and thus a temperature region of the supercooling liquid $\Delta T_x$ ($=T_x-T_g$) of 60° C., wherein these temperatures are determined at a heating rate of 10° C./min by a thermal mechanical analyzer (TMA) using a test piece having a length of 10 mm and a cross-section of 0.023 mm$^2$, as shown in FIG. 1.

The glassy alloy composition satisfying this condition has a sufficiently wide temperature range of the supercooling liquid $\Delta T_x$, which is a transitional region between the crystallization temperature $T_x$ and the glass transition temperature $T_g$ and has high formability of the amorphous phase. As a result, an amorphous ribbon or bulk having a relatively large thickness or an amorphous wire having a large diameter can be formed by some methods, which will be described later. Thus, MI elements having different shapes can be formed.

Figure 5:
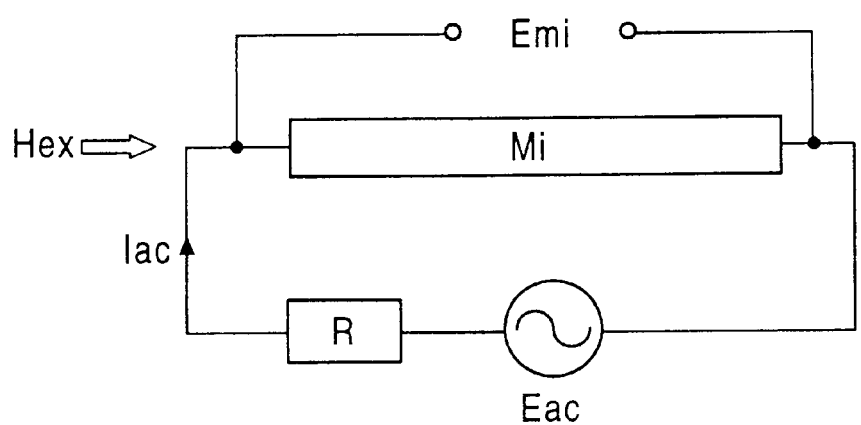
FIG. 5 is a general circuit diagram for measuring magnetic impedance characteristics.

For example, a ribbon is formed of a glassy alloy represented by the formula (2) and is mounted as a magnetic material, that is, the magnetic material Mi in the measuring circuit shown in FIG. 5. When an external magnetic field Hex is applied in the longitudinal direction of the MI element while an alternating current of 3 MHz is applied, the output voltage (Eme) straightly and symmetrically increases as the external magnetic field increases or decreases from zero. Thus, the MI element has magneto-impedance effects with excellent linearity. The MI element represented by the formula is more sensitive than a conventional glassy alloy represented by $Fe_{78}Si_{19}B_{13}$, and thus a sensing circuit using the MI element in accordance with the present invention can be used with a low amplification which can suppress noise generation. Further, the MI element shows a moderate increase in the output voltage within a very weak magnetic field (−2 Oe to +2 Oe) compared with another conventional glassy alloy represented by $(Fe_6Co_{94})_{72.5}Si_{12.5}B_{16}$, and is highly quantitative. The sensitivity is highly symmetric and linear in response to both positive and negative magnetic fields, a magnetic sensing circuit with a simplified configuration can be fabricated. Accordingly, the MI element in accordance with the present invention is suitable for a magnetic sensing element.

A glassy alloy is produced from the above-mentioned composition as follows. The powdered constituents are mixed based on a given composition, and the mixture is melted in an arc-melting unit in an inert gas atmosphere of Ar or the like to form a mother alloy having the given composition. The mother alloy is heated to a temperature which is higher than the melting point of the alloy and solidified by a single roll process or a melt spinning process.

Since the glassy alloy in accordance with the present invention has a wide temperature range of the supercooling liquid $\Delta T_x$ of 20° C. or more, and preferably 50° C. or more, an amorphous solid is obtainable without quenching which is essential for conventional glassy alloys. A thin film can also be produced by a conventional quenching process, such as a single roll process. In addition, products having a considerable thickness, such as ribbons and wires, can be produced by a casting process or a liquid cooling process.

In the single roll process, a melt having a given composition is sprayed to quench onto a rotating metallic roll. A ribbon glassy alloy is thereby obtained. A ribbon having a relatively high thickness is obtained from the glassy alloy composition in accordance with the present invention by employing a moderated cooling rate. A wide temperature range of the supercooling liquid $\Delta T_x$ in the glassy alloy of the present invention enables a forming process by annealing or slow cooling, such as a casting process using a copper mold. Other general casting apparatuses such as a continuous casting unit can also be used.

A MI element wire can be produced using the glassy alloy composition in accordance with the present invention by, for example, a liquid cooling process as described in Japanese Patent Laid-Open No. 4-323351. In this process, the alloy composition is melted and continuously sprayed into a cooling liquid to solidify the melt into a wire. The liquid cooling processes are classified into a jetting process which jets the cooling liquid, a centrifugal process, and a melt spinning process which will be described later.

Figure 3:
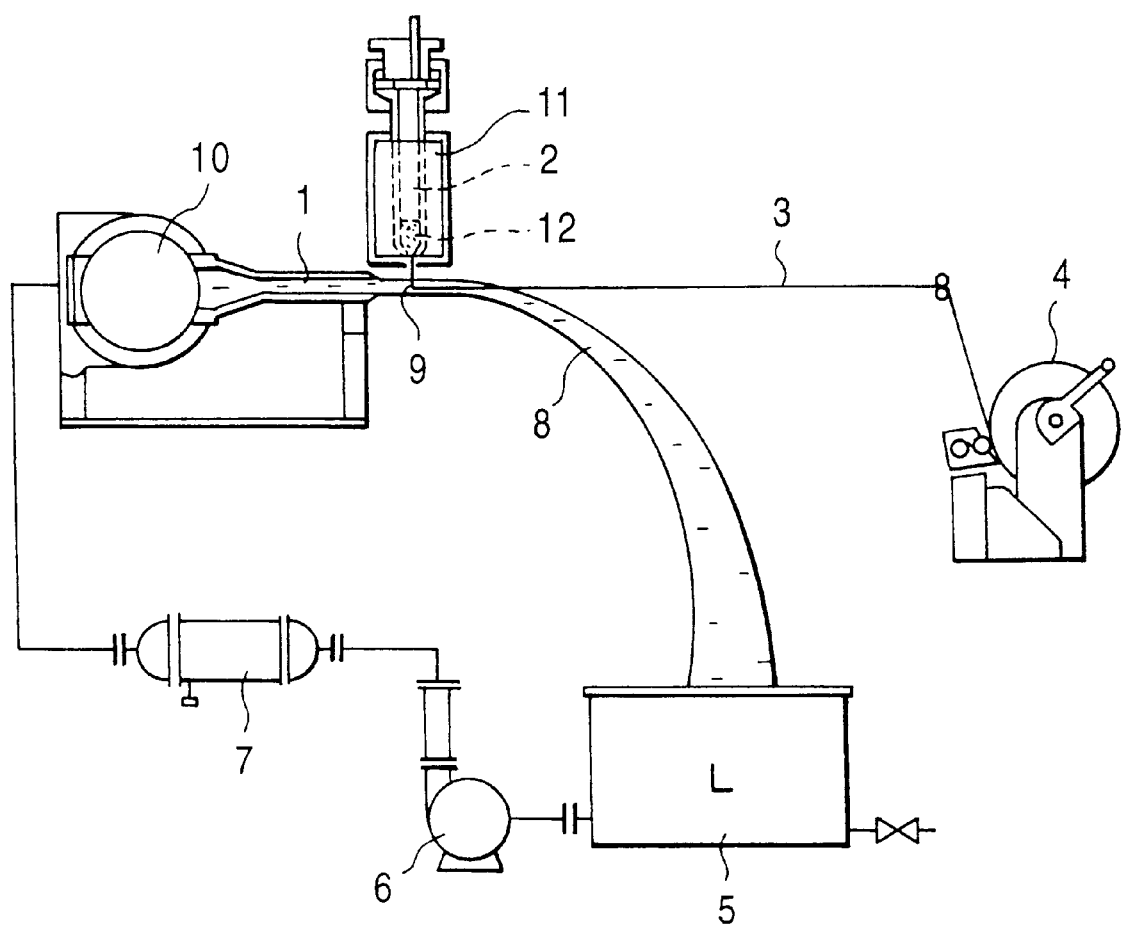
FIG. 3 is a schematic view illustrating a method for making a MI element in accordance with the present invention.

In the jetting process, as shown in FIG. 3, a cooling liquid L in a liquid reservoir 5 is pressurized by a pressurizing pump 6, cooled to a given temperature by a cooler 7, and pressurized to a given pressure by a pressurizing pump 10. The pressurized liquid L is jetted through a jetting nozzle 1 at a given rate to form a jet stream 8 towards the liquid reservoir 5. The alloy composition 12 is melted in a heating oven 11, fed into a melt jetting unit 2, and jetted from the melt-jetting unit 2 by means of a gaseous argon pressure. The jetted alloy stream 9 is rapidly cooled by the jet stream 8 of the cooling liquid from the jetting nozzle 1 to form a MI element wire 3. The resulting MI element wire 3 is wound on a winding machine 4.

Figure 4:
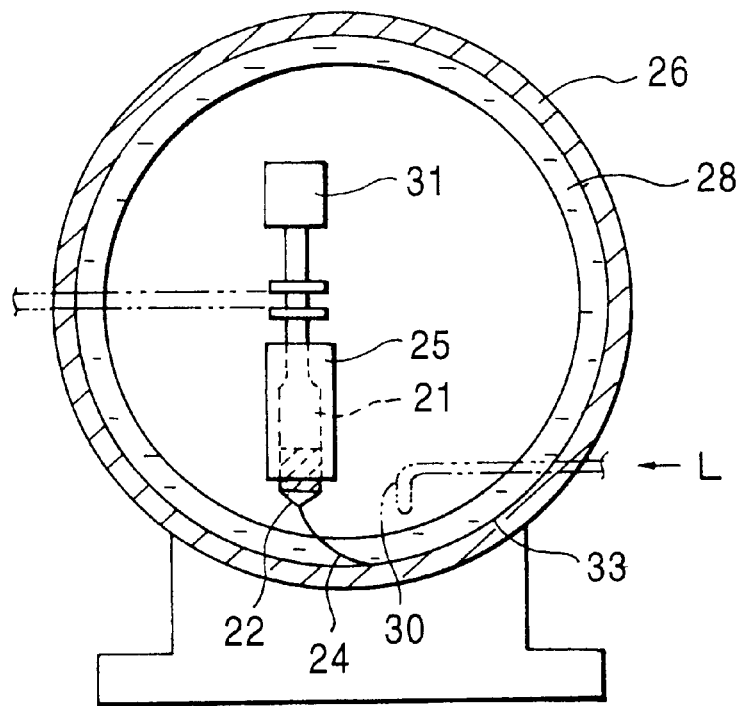
FIG. 4 is a schematic view illustrating another method for making a MI element in accordance with the present invention.

In the centrifugal process, as shown in FIG. 4, the alloy composition is fed into a crucible 21 through a feeding port 31 by gaseous argon, and melted in a heating oven while rotating a drum 26 at a given rotation rate by a driving motor not shown in the drawing. A cooling liquid L is supplied onto an inner face of the drum 26 through a cooling solution feeding pipe 30 to form a cooling liquid layer 28 by means of a centrifugal force. A nozzle 22 of the crucible 21 is lowered so as to approach the surface of the cooling liquid layer 28 and the melt 24 is jetted onto the surface of the cooling liquid layer 28, while feeding an inert gas into the crucible 21 in order to prevent the melted alloy from oxidizing.

The alloy jetted onto the surface of the cooling liquid layer 28 is solidified to form a MI element wire 33, and is wound along the inner wall of the drum 26 by the jetting force, the rotation of the drum and the centrifugal force. After completion of the spinning, the tip of the cooling solution feeding pipe 30 is lowered into the cooling liquid layer 28 to remove the cooling liquid by suction. The drum 26 is stopped to remove the MI element wire 33 from the drum 26.

The following are possible theoretical grounds for illustrating that the glassy alloy forming the MI element of the present invention has high formability of the amorphous phase, but not for limiting the present invention. Since the composition is composed of elements having a large difference in atomic diameter and a negative heat of mixing, the liquid state has a highly disordered packing structure. As a result, the solid/liquid interfacial energy increases so as to suppress the formation of crystal nuclei in the liquid phase. Further, the highly disordered packing structure inhibits long-distance diffusion of atoms which is essential for the formation of the crystal phase.

The MI element of the glassy alloy in accordance with the present invention has soft magnetism, and is sensitive to a change in the magnetic field in the longitudinal direction of the MI element as in generally used MI elements. A coil for a magnetic sensor head prepared using the glassy alloy is excited in the circumferential direction by leading a current, whereas the demagnetizing field caused by a magnetic field in the longitudinal direction of the head is significantly small. Thus, the head length can be significantly reduced compared with high-sensitivity magnetic flux detecting type magnetic sensors such as a flux gate sensor. Further, the magnetic sensor head has a rate of change in impedance of several tens %/Oe to 100%/Oe, a high resolution of $10^{-6}$ Oe, and a cutoff frequency of several MHz. Accordingly, a magnetic sensor head having high sensitivity and a significantly reduced size can be produced. For example, a significantly small head length of 1 mm or less does not cause deterioration of the sensitivity for detecting a magnetic field, and can detect a minimum magnetic field of $10^{-6}$ for an alternating current magnetic field of 1 Hz or more. Thus, it can clearly detect a surface magnetic field (approximately 0.1 Oe at a position approximately 2 mm distant from the surface) of a ring magnet for a rotary encoder having a diameter of 19 mm and thousand poles (magnetization distance: approximately 60 $\mu$m) at a position 1 mm or more distant from the surface. Further, it can readily detect geomagnetism (approximately 0.3 Oe).

A magnetic head, a thin film magnetic head, an azimuth sensor, and an autocanceler using the MI element in accordance with the present invention will now be described in detail.

The magnetic head using the MI element of the present invention has high-speed responsiveness using a change in the magnetic flux which quickly responds to the rotation of the magnetization. When a high-frequency current is applied to the coil, the impedance sensitively changes in response to the external magnetic field by the skin effects, and the movement of the magnetic wall is suppressed by a strong overcurrent restriction. Thus, only the rotation of the magnetization vector generates a circumferential magnetic flux, resulting in high-speed responsiveness.

Figure 7:
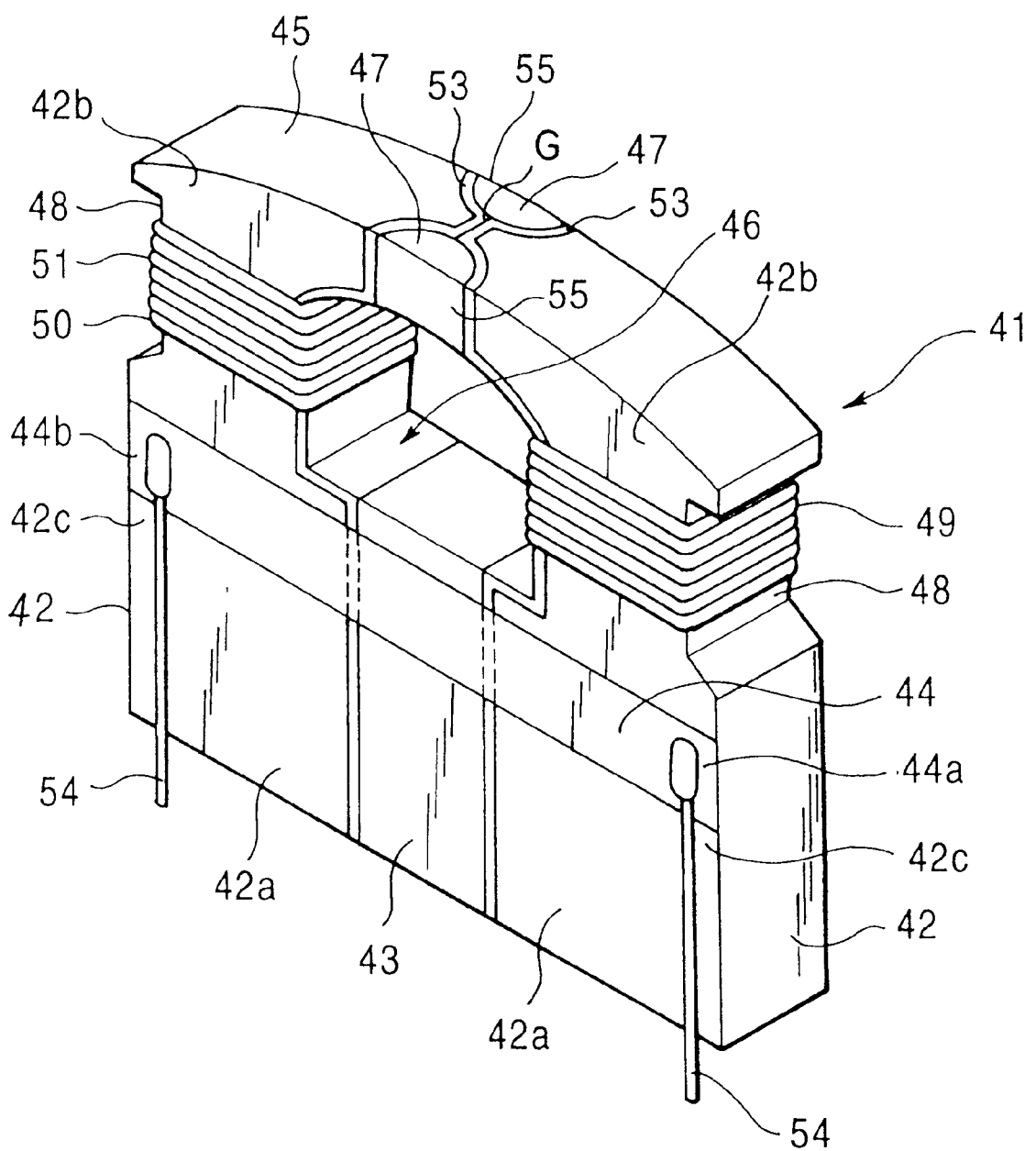
FIG. 7 is an isometric view of a magnetic head in accordance with an embodiment of the present invention.
Figure 8:
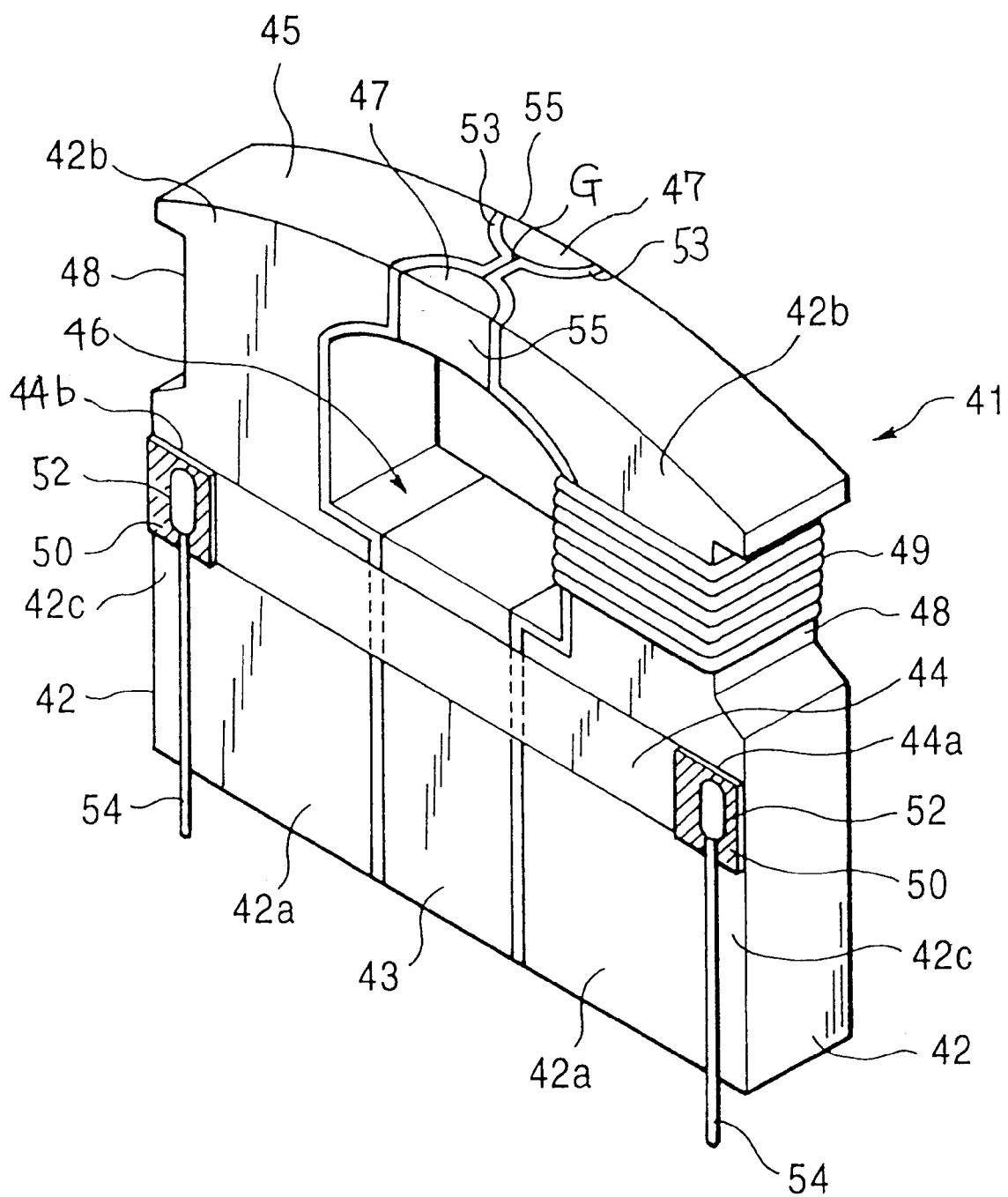
FIG. 8 is an isometric view of a magnetic head in accordance with an embodiment of the present invention.

For example, in FIGS. 7 and 8, a magnetic head 41 has a pair of cores 42 and 42, a bonding glass 43 which is interposed between and bonded to the lower portions 42a and 42a of the paired cores 42 and 42, and a thin film MI element 44. A sliding face 45 for sliding a recording medium not shown in the drawing is formed on the top faces 42b and 42b of the cores 42 and 42, and a magnetic gap G is provided in the center. The MI element 44 is bonded to the side faces of the cores 42 and 42. That is, two ends in the longitudinal direction of the MI element 44 are bonded to the magnetic circuit connecting faces 42c and 42c of the cores 42 and 42 by any means. An external magnetic field by the recording magnetization on the recording medium is therefore applied to the MI element 44 through the cores 42 and 42. A closed magnetic circuit is formed between the cores 42 and 42, the MI element 44 and the magnetic gap G.

The bonding glass 43 composed of a nonmagnetic material separates the paired cores 42 and 42. The cores 42 and 42 have indented sections on the inner sides of the upper portions. The cores 42 and 42 and the bonding glass 43 form a coiling cavity 46 between the two indented sections. The cores 42 and 42 are composed of ferrite which is a ferromagnetic oxide. Examples of ferritic materials suitable for cores of magnetic heads include MnZn polycrystalline ferrite, MnZn single-crystal ferrite, and MnZnSn polycrystalline ferrite. These ferritic materials have high saturation magnetic flux density, high permeability, small eddy current loss due to large electrical resistance, and high abrasion resistance due to high hardness.

A pair of regulating grooves 47 and 47 are provided at the upper junction of the cores 42 and 42. The regulating grooves 47 and 47 regulate the track width of the magnetic gap G and are filled with nonmagnetic glass 25. A coiling groove 48 is formed on the outer face of the upper portion of each core 42 and a coil 49 is wound around the coiling groove 48.

The MI element 44 is composed of a soft magnetic glassy alloy containing at least one metal selected from the group consisting of Fe, Co and Ni. In the embodiment shown in the drawings, it is a ribbon. Alternatively, the MI element 44 may be a plurality of twisted wires.

The magnetic head 41 has a biasing means which applies a bias magnetization to the MI element 44. In an embodiment of the biasing means 50, as shown in FIG. 7, a biasing current is introduced into the biasing coil 51 wound around the coiling groove 48 so as to apply a magnetic flux to the core 32, and the magnetic flux is applied to the MI element 14 through the core 42 as a biasing magnetization.

In another embodiment of the biasing means 50 as shown in FIG. 8, the magnetization of permanent magnet layers 52 provided at two ends 44a and 44b of the MI element 44 is applied to the MI element 44 as a biasing magnetization. The permanent magnetic layer 52 may be composed of any hard magnetic material, and preferably a hard magnetic material such as a Fe—Nd—B system or Co—Cr—Pt system magnetic material. The Fe—Nd—B system and Co—Cr—Pt system hard magnetic materials have high remanent magnetization, and significantly high coercive force, hence a permanent magnet 52 with a reduced volume can apply a sufficiently high biasing magnetization to the MI element 44.

The permanent magnetic layers 52 are deposited on the two ends 44a and 44b of the MI element 44 by a film deposition process such as a sputtering process. Leads 54 and 54 for extracting the output signals are connected to the ends 44a and 44b of the MI element 44. Leads for applying an alternating current (not shown in the drawing) are also connected to the MI element 44.

Metallic magnetic films 53 are formed on the cores 42 and 42 of the magnetic head 41 by a film deposition process such as a sputtering process. A gap layer not shown in the drawing is formed on the metallic magnetic films 53 to configure a metal-in-gap (MIG) type magnetic head. The metallic magnetic film 53 is generally composed of a soft magnetic alloy having a higher permeability. Examples of preferred soft magnetic alloys include Fe—Si—Al system alloys, Fe—Ni system alloys and amorphous alloys. The gap layer is composed of a nonmagnetic material such as $SiO_2$, $Al_2O_3$, and $CrSiO_2$.

The above-mentioned glassy alloy which is used as the MI element 44 is capable of forming by slow cooling and thus producing a ribbon or wire with a relatively high thickness. Further, a stable amorphous alloy is obtained.

The MI element 44 composed of a soft magnetic glassy alloy in accordance with the present invention is produced by a casting process, a quenching process using a single roll or twin roll, a melt spinning process, or a solution extraction process. These processes enable the formation of the MI element 44 having a desired shape, such as a bulk, a ribbon, or a wire. Thus, the resulting MI element 44 can have a thickness and a size, which are at least 10 times larger than those of conventional ribbon MI elements composed of amorphous alloys. The MI element 44 having high versatility of possible shapes allows easy design and production of a magnetic head 41.

When an alternating current of a MHz band is applied while an external magnetic field is applied to the MI element 44 in the longitudinal direction, the MI element 44 shows magneto-impedance effects, that is, the impedance of the MI element 44 increases with the absolute value of the external magnetic field, and the increase is symmetrical with respect to an external magnetic field of zero.

The magnetic head 41 has a closed magnetic circuit formed between the paired cores 42 and 42, the MI element 44 composed of the soft magnetic glassy alloy, and the magnetic gap G. When a high-frequency alternating current is applied to the MI element 44, the impedance of the MI element 44 sensitively changes depending on a change in the magnetic flux of the external magnetic field that is applied from a recording medium through the cores 42 and 42. Thus, the magnetic head has high sensitivity.

Since the movement of the magnetic wall in the MI element 44 is suppressed by strong overcurrent restriction, a circumferential magnetic flux occurs only by the rotation of the magnetic vector. Thus, the magnetic head 41 can respond to a high-speed magnetic change.

The high-speed responsiveness of the magnetic head is an essential factor for the detection of magnetic information on magnetic recording media. For example, when a 2000-pole ring magnet with a diameter of 19 mm rotates at 3,600 rpm, a MHz-band cutoff frequency is required for detecting a fundamental wave of 120 kHz and the harmonic waves of several times. The cutoff frequency in current video tape recorders is 4.75 MHz, but it will be 50 MHz in future. The magnetic head 41 having the MI element 44 in accordance with the present invention can respond to the future demand by applying an alternating current of 500 MHz or more.

The magnetic head 41 having the MI element 44 can combine with a self-oscillator such as a Colpitts oscillator to form an amplitude-modulation-type magnetic head. Such a magnetic head can detect a wide range of magnetic fields over a direct current to a high frequency of several MHz with a high sensitivity of approximately $10^{-6}$ Oe. Thus, the magnetic head can detect recorded magnetization on recording media having high-density recording information.

A MI element generally shows a symmetrical change in impedance with respect to an external magnetic field of zero, hence the magnetic head requires direct current magnetic biasing. Since the MI element 44 in accordance with the present invention has a high linearity at a very weak magnetic field, it can respond with a very weak biasing magnetic field. Thus, a biasing current of several mA is introduced into the biasing coil 51 of the biasing means 50, and such a weak biasing current enables a simplified circuit configuration.

Alternatively, permanent magnets 52 and 52 with a small magnetization can be provided at both ends 44a and 44b of the MI element 44. Since the permanent magnets 52 and 52 have a reduced volume, the magnetic head 41 can be miniaturized.

Since the cores 42 and 42 are composed of ferrite, they can apply the recorded magnetization on a recording medium to the MI element 44 without loss. The magnetic head 41, therefore, has high sensitivity. Since ferrite has excellent workability and formability, cores having complicated shapes can be readily produced.

The magnetic head 41 having the recording coil 49 can write recording magnetization on magnetic recording medium. Accordingly, the magnetic head 41 having the MI element 44 can be used as a reading/writing head.

The magnetic head 41 is composed of a soft magnetic glassy alloy as the MI element 44 which is subjected to heat treatment at 427° C. to 627° C. The MI element 44 has excellent soft magnetism and improved magneto-impedance effects. Accordingly, the magnetic head 41 has high sensitivity.

A thin film magnetic head as a third embodiment of the present invention will now be described with reference to the drawings.

Figure 9:
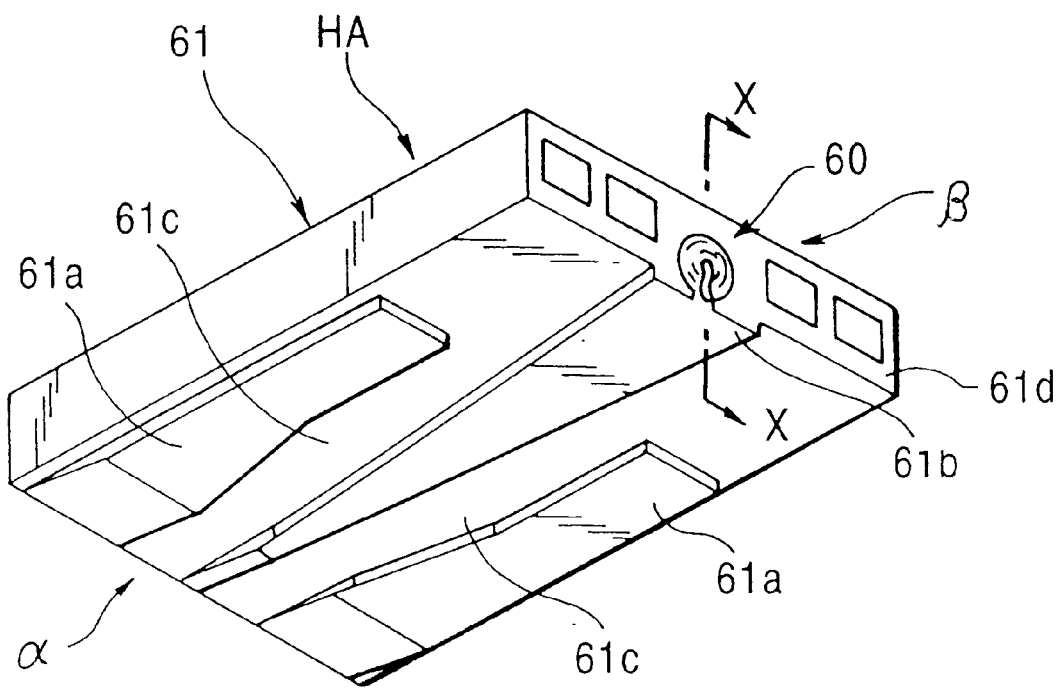
FIG. 9 is an isometric view of a thin film magnetic head having a MI element in accordance with the present invention.

A thin film magnetic head HA shown in FIG. 9 is of a floating type which is mounted in hard disk drive units and the like. A slider 61 of the thin film magnetic head HA has a leading side ($\alpha$) lying upstream of the moving direction of a disk and a trailing side ($\beta$) lying downstream of the moving direction. The surface of the slider 61, facing the disk, has rail faces 61a, 61a and 61b and air grooves 61c and 61c. A thin film magnetic head core 60 is provided on the side face 61d at the trailing side ($\beta$) of the slider 61.

Figure 10:
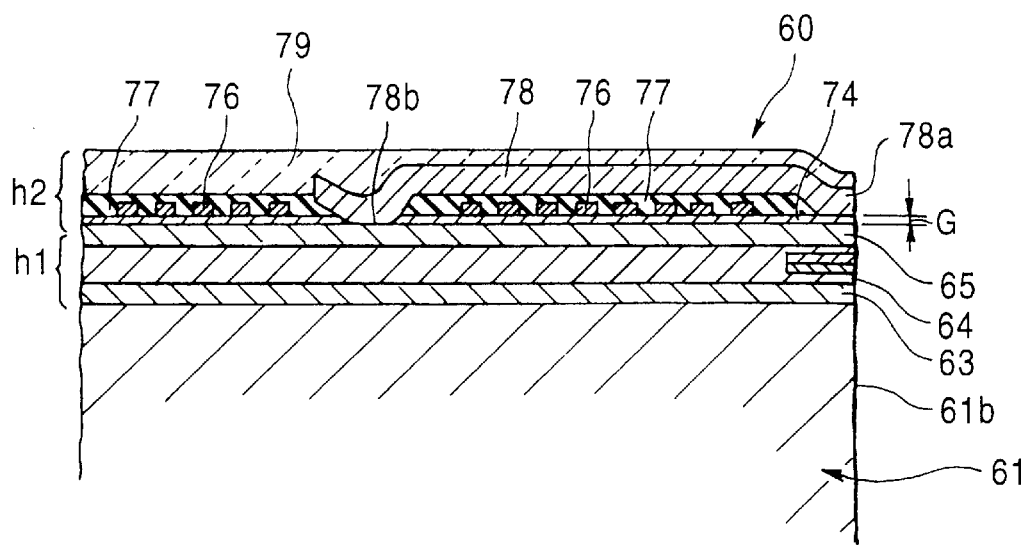
FIG. 10 is a cross-sectional view of a main part of the thin film magnetic head shown in FIG. 9.
Figure 11:
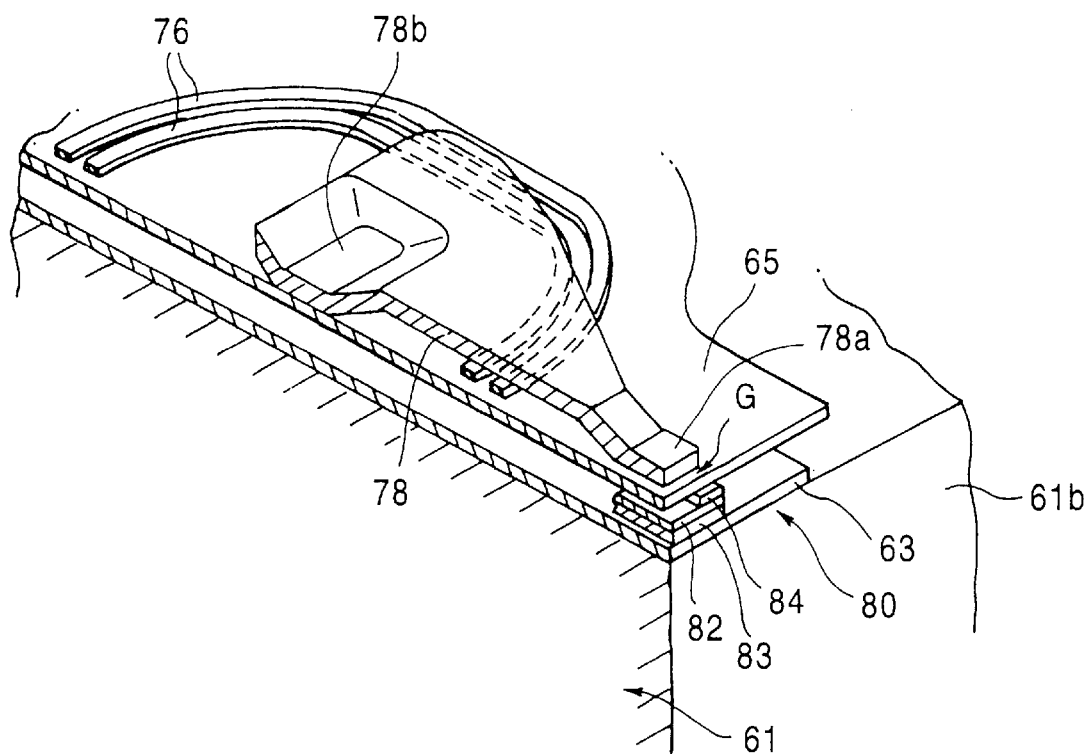
FIG. 11 is a cross-sectional isometric view of a main part of the thin film magnetic head shown in FIG. 9.

The thin film magnetic head core 60 is a complex magnetic head having a cross-sectional configuration as shown in FIGS. 10 and 11. A MI element head (reading head) $h_1$ and an inductive head (magneto-inductive-type magnetic head: writing head) $h_2$ are deposited in that order on the side face 61d at the trailing side ($\beta$). The MI element head $h_1$ detects a leakage flux as a magnetic signal from recording media such as magnetic disks by means of MI effects.

Figure 12:
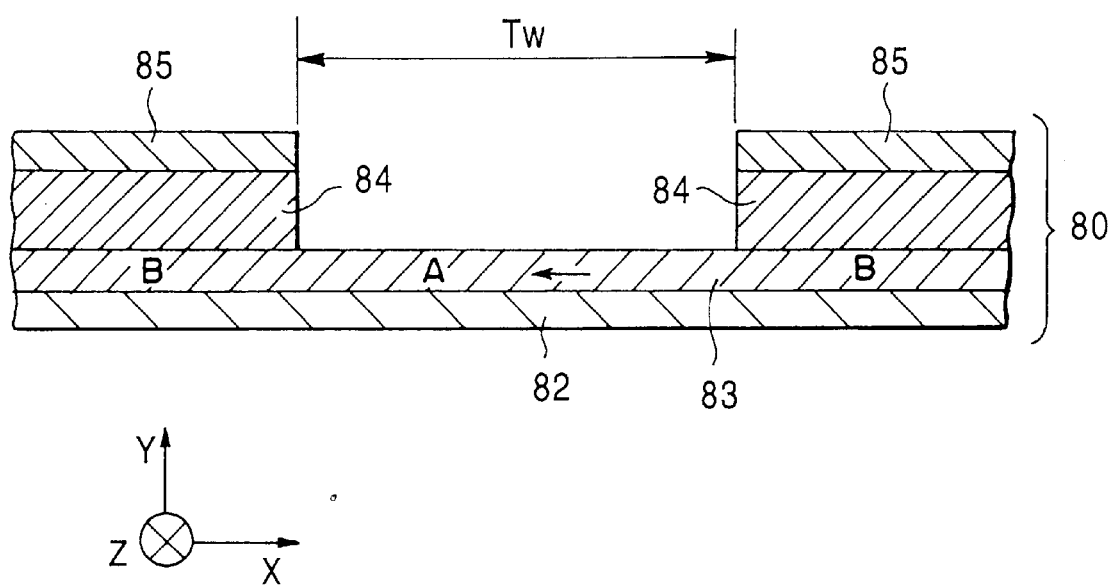
FIG. 12 is a cross-sectional view of an embodiment of a thin film MI element used in the thin film magnetic head shown in FIG. 9.

As shown in FIG. 10, in the MI element head $h_1$, a lower gap layer 63 composed of a magnetic alloy such as an Fe—Al—Si alloy is formed on the side end of the slider 61, and an upper gas layer 64 composed of a nonmagnetic material such as alumina ($Al_2O_3$) is formed thereon. Further, a MI element 80 having a cross-sectional configuration as shown in FIG. 12 is interposed in the upper gap layer 64 at the edge. An upper shielding layer is formed on the upper gap layer 64. The upper shielding layer also functions as a lower core layer 65 of the inductive head $h_2$ which is provided thereon.

FIG. 12 shows an embodiment of the MI element 80 applied to the MI element head $h_1$. The MI element 80 includes a thin film MI element 82 composed of a glassy alloy, a ferromagnetic thin film 83 deposited thereon, antiferromagnetic thin films 84 deposited apart on both ends of the ferromagnetic thin film 83 by a distance $T_w$, and electrode films 85 deposited on the antiferromagnetic thin films 84.

Fe—P—C system, Fe—P—B system and Fe—Ni—Si—B system alloys among Fe alloys have been known as alloys having glass transformation. No supercooling liquid zone is observed in these Fe alloys, thus these alloys cannot be used as the glassy alloy in accordance with the present invention.

In contrast, the glassy alloy used as the thin film MI element in accordance with the present invention has a temperature region $\Delta T_x$ of the supercooling liquid of 20° C.

or more, and 35° C. to 60° C. in particular compositions. Also, the glassy alloy has excellent soft magnetism at room temperature. Accordingly, the Fe-based soft magnetic glassy alloy in accordance with the present invention having the MI effect is a novel alloy which is quite different from the conventional Fe-based alloys.

The ferromagnetic thin film 83 is composed of a Ni—Fe alloy, a Co—Ni alloy, a Ni—Co alloy, or a Ni—Fe—Co alloy. Alternatively, the ferromagnetic thin film 83 may have a layered structure of a Co thin film and a Ni—Fe alloy thin film.

The antiferromagnetic thin film 84 is preferably composed of a FeMn alloy, NiO, a Cr—Al alloy, or an X—Mn alloy having an irregular structure, wherein X is at least one element selected from the group consisting of Ru, Rh, Ir, Pd and Pt. The antiferromagnetic thin film 84 applies a bias magnetic field by an exchange coupling magnetic field to the thin film MI element 82 being in contact with the ferromagnetic thin film 83.

With reference to FIG. 10, in the inductive head $h_2$, a gap layer 74 is formed on the lower core 65, a spirally-patterned planar coil layer 76 is formed thereon, and the coil layer 76 is surrounded with an insulating layer 77. An upper core layer 78 is formed on the insulating layer 77. The tip 78a of the upper core layer 78 faces the lower core layer 65 with a slight distance at the rail face 61b in order to form a magnetic gap G and to magnetically connect the base 78b of the upper core layer 78 and the lower core 65. A protective layer composed of, for example, alumina is formed on the upper core 78.

As materials for the lower core 65 and the upper core 78, conventional soft magnetic materials having excellent saturation magnetic flux density and permeability can be used. Examples of such materials include permalloy, Fe—Al—Si alloys, and ferrite. Alternatively, these cores may be composed of the soft magnetic glassy alloy described below.

The soft magnetic glassy alloy has a composition represented by the following formulae:

$$(Fe_{1-a-b}Co_aNi_b)_{100-x-y}M_xB_y,$$

or $$(Fe_{1-a-b}Co_aNi_b)_{100-x-y-z}M_xB_yT_z$$

Thus, this glassy alloy has the same composition as that of the glassy alloy used in the thin film MI element 82, and has excellent soft magnetism.

In the inductive head $h_2$, a recording current flows in the coil layer 76 to cause a current in the core layers. A magnetic signal is recorded onto a recording medium such as a hard disk by a leakage magnetic flux from the tips of the lower core 65 and the upper core 78 composed of the glassy alloy at the magnetic gap G.

In the MI element head $h_1$, a very weak leakage magnetic field from a recording medium such as a hard disk causes a change in impedance of the thin film MI element 82. Thus, the information recorded on the recording medium can be read as such a change in the impedance.

An embodiment of a circuit for measuring the MI effects of the thin film MI element 82 will now be described. In the circuit configuration as shown in FIG. 5, an alternating current Iac of a MHz band is applied to the thin film MI element 82 through the electrical power source Eac, while an external magnetic field Hex is applied to the thin film MI element 82 in the longitudinal direction. A voltage Emi caused by an impedance inherent in the material is thereby generated between both ends of the thin film MI element 82, even if the external magnetic field hex is a very weak magnetic field of several gausses. Its amplitude changes at a high rate in response to the intensity of the external magnetic field Hex. Accordingly, this circuit can detect a very weak magnetic field.

The configuration of the thin film magnetic head HA using the thin film MI element 82 is determined such that the sensitivity is not disturbed by floating impedance of the circuit caused by the high-frequency current. Accordingly, a preferred configuration is the above-mentioned self-oscillation magnetic sensing circuit in which the MI head and the high-frequency power source are integrated.

Figure 13:
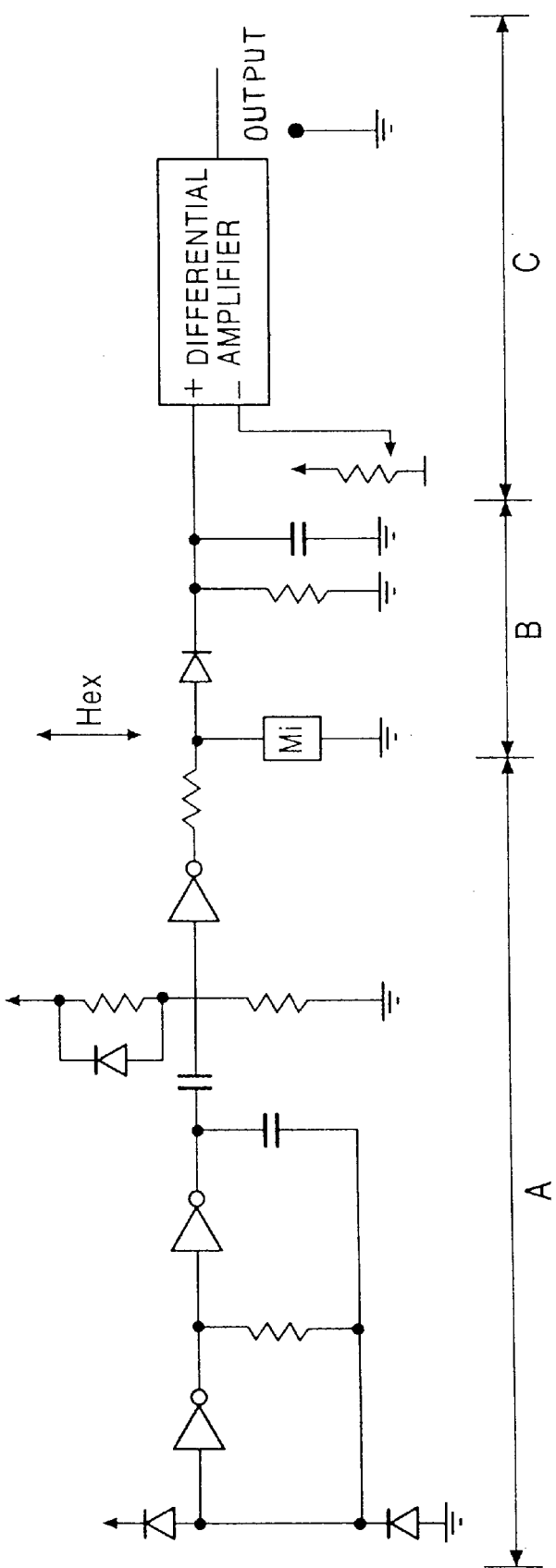
FIG. 13 is a circuit diagram of a sensing device using a MI element in accordance with the present invention.

FIG. 13 shows a magnetic sensing circuit having the self-oscillation circuit. In the circuit shown in FIG. 13, blocks A, B and C correspond to a high-frequency electrical power source section, an external magnetic field detecting section, and an amplification section, respectively. The external magnetic field detecting section B is connected to the thin film MI element 82 of the thin film magnetic head HA.

The high-frequency electrical power source section A generates a high-frequency alternating current to supply to the external magnetic field detecting section B. The system is not limited. In this embodiment, a stabilized Colpitts oscillator is used. The self-oscillation system may be sensitive to the external magnetic field by magnetic modulation, such as amplitude modulation (AM), frequency modulation (FM) or a phase modulation (PM).

The external magnetic field detecting section B includes the thin film MI element 82 provided in the MI element head $h_1$ of the thin film magnetic head HA, and a demodulation circuit. The thin film MI element 82, which is in a waiting sate by a high-frequency alternating current from the high-frequency power source section A, causes a change in impedance in response to the external magnetic field (Hex). A demodulation circuit demodulates such a change to transmit the demodulated signal to the amplification section C.

The amplification section C includes a differential amplification circuit and output terminals. The magnetic sensing circuit has a negative feedback loop circuit and functions as a very weak magnetic sensing circuit with high accuracy, high sensitivity, high-speed response and high stability by a strong negative feedback.

Figure 2:
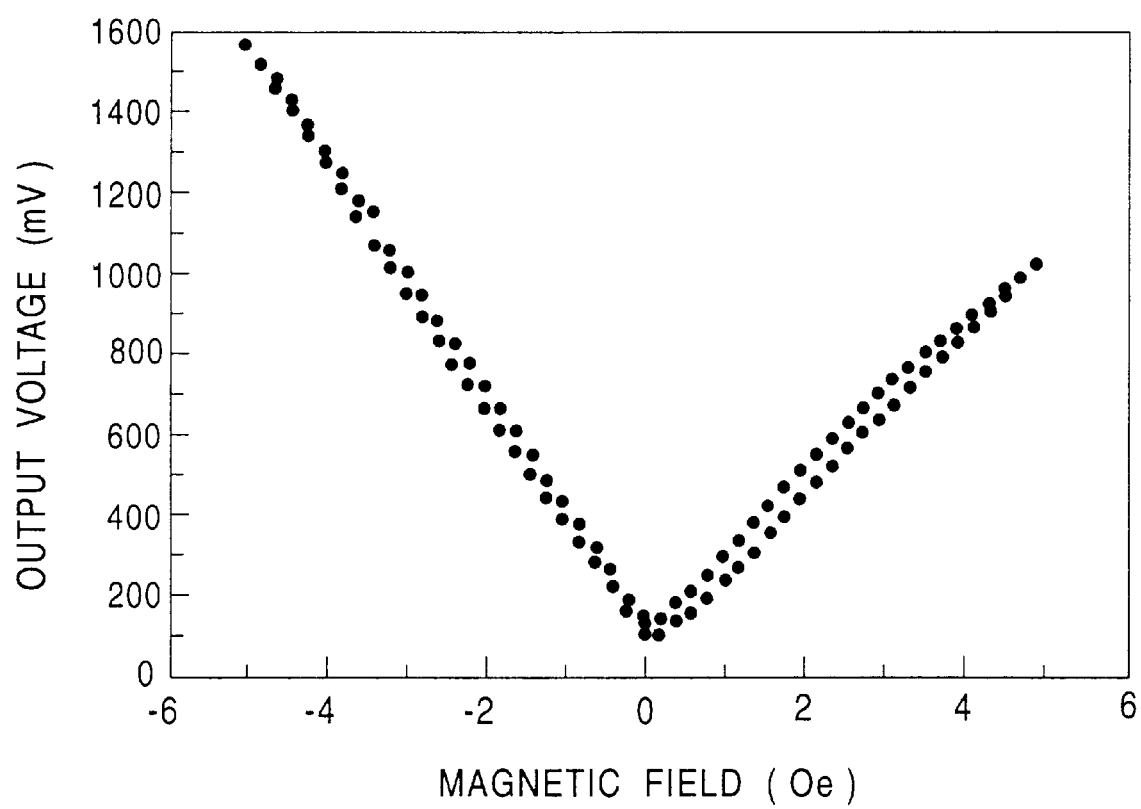
FIG. 2 is a graph showing magnetic sensitivity of a MI element in accordance with the present invention.
Figure 6:
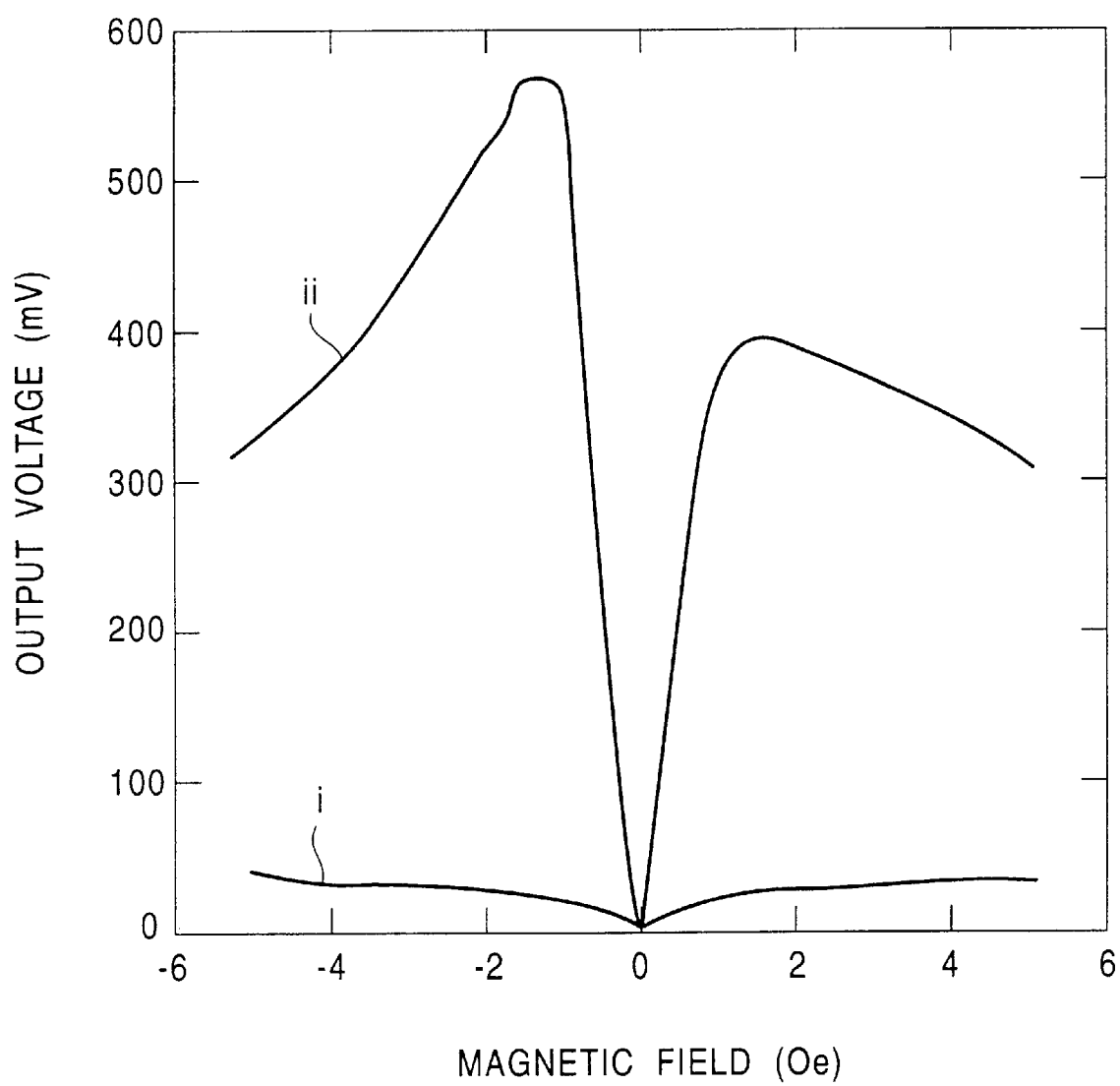
FIG. 6 is a graph showing magnetic sensitivity of a conventional MI element.

FIGS. 2 and 6 show sensitivity of various materials to a magnetic field. The curves i and ii shown in FIG. 6 represent sensitivity characteristics of conventional alloys, and the curve shown in FIG. 2 represents magnetic sensitivity of the thin film MI element 82 of the glassy alloy in accordance with the present invention. The thin film MI element 82 of the present invention has excellent linearity in the output voltage to the external magnetic field regardless of the polarity of the external magnetic field. When the thin film magnetic head is of a linear detective type enabling a linear response, a direct biasing current is preferably applied. The thin film MI element 82 in accordance with the present invention has a high linearity in a very weak magnetic field for a very weak biasing magnetic field.

An exchange coupling magnetic field by the effect of the antiferromagnetic thin film 84 in FIG. 12 is used for application of the biasing magnetic field. In the configuration as shown in FIG. 12, the ferromagnetic thin film 83 is biased by anisotropic exchange coupling at the interface between the ferromagnetic thin film 83 and the antiferromagnetic thin film 84. In FIG. 12, regions B in which the ferromagnetic thin film 83 comes into contact with the antiferromagnetic thin films 84 is magnetized to form a single domain in the X direction. The ferromagnetic thin film 83 is biased by a single domain in the X direction in the region A within the track width $T_w$. When a leakage magnetic field from the magnetic recording medium is applied to the thin film MI element 82 adjoining the biased ferromagnetic thin film 83, the impedance varies in relation to the leakage magnetic field. Thus the leakage magnetic field can be detected by a change in the impedance.

The thin film magnetic head HA using the thin film MI element in accordance with the present invention senses a change in the magnetic field in the longitudinal direction (X direction in FIG. 12) of the thin film MI element. The thin film magnetic head HA has high sensitivity, that is, a rate of change in impedance of several tens to 100 percent/Oe, a high resolution of $10^{-6}$ Oe and a cutoff frequency of several MHz. The sensitivity does not deteriorate when the head length is ultimately reduced, and a minimum detection limit for an alternating current magnetic field of 1 Hz or more reaches $10^{-6}$ Oe.

Since the thin film magnetic head HA uses a change in the magnetic flux by the rotation of magnetization which has quick response, the head has high-speed responsiveness. That is, when a high frequency current is applied, the impedance sensitively changes in response to the external magnetic field by skin effects, resulting in high sensitivity. Further, the movement of the magnetic wall is suppressed by a strong overcurrent restriction, and the movement of the magnetization vector causes generation of a magnetic flux. Thus, the head has high-speed responsiveness. An amplitude modulation sensor having a self-oscillation circuit such as a Colpitts oscillator using the thin film MI element 82 in accordance with the present invention has a cutoff frequency which is one-tenth the oscillation frequency. The sensor can detect a wide range of magnetic fields from a direct magnetic field to a high frequency magnetic field of several MHz for an oscillation frequency of several tens MHz with a resolution of approximately $10^{-6}$ Oe. Accordingly, the thin film magnetic head can detect a very fine magnetic field from the magnetic recording medium with high sensitivity.

Figure 14:
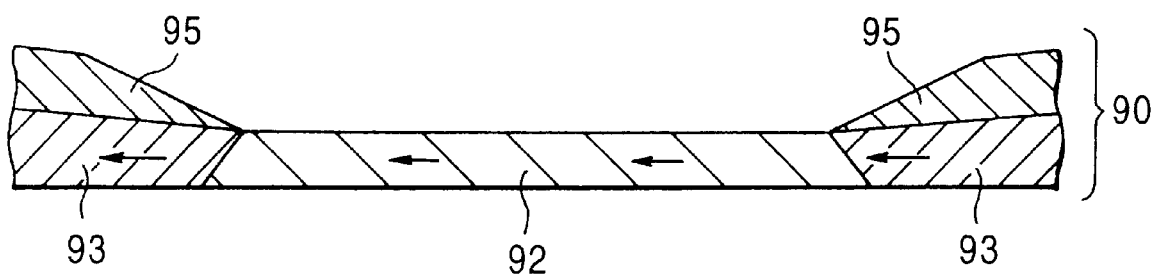
FIG. 14 is a cross-sectional view of another embodiment of a thin film MI element.
Figure 14:
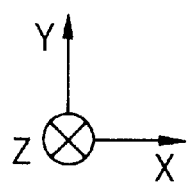

FIG. 14 shows another embodiment of the thin film MI element in accordance with the present invention. Magnet layers (permanent magnets) 93 and 93 are arranged on both sides of the thin film MI element 92 composed of a glassy alloy, and electrode films 95 are deposited on the magnet layers 93 and 93. A leakage magnetic field from the magnet layers 93 and 93 biases the thin film MI element 92.

Each magnet layer 93 is composed of a hard magnetic material, such as a Co—Pt system alloy or a Co—Cr—Pt system alloy. The MI element is also biased as in the above-mentioned embodiment, and thus can read and write the magnetic information from and on a magnetic recording medium by the MI effects.

The reading head $h_1$ is composed of a glassy alloy MI element in the above-mentioned embodiment. When at least one of the lower core 65 and the upper core 78 of the writing head is composed of a glassy alloy, the reading head $h_1$ may be composed of a magnetoresistive (MR) element.

Figure 15:
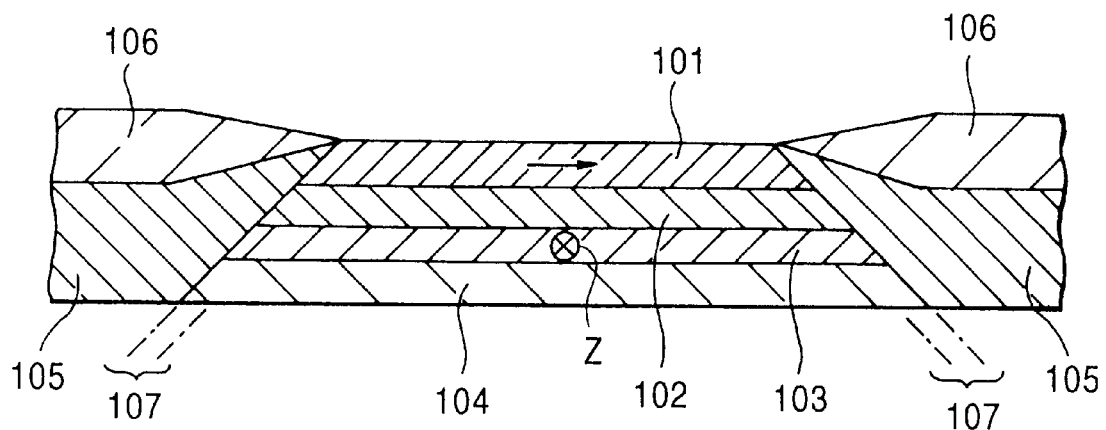
FIG. 15 is a cross-sectional view of an embodiment of a MI element for forming a reading head.
Figure 15:
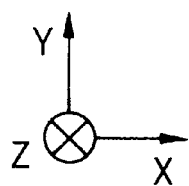

FIG. 15 shows a reading head $h_1$ of the thin film magnetic head HA using a MR element. Among magnetoresistive reading heads (MR heads), giant magnetoresistive (GMR) heads using a spin-dependent scattering phenomenon of conductive electrons have been known. As an example of the GMR heads, a spin-valve head having high magnetoresistive effects for a weak external magnetic field is disclosed in U.S. Pat. No. 5,159,513.

The MR element shown in FIG. 15 is of a spin-valve type. A free ferromagnetic layer 101, a nonmagnetic interlayer 102, a pinned ferromagnetic layer 103 and an antiferromagnetic layer 104 are deposited on a substrate. Magnet layers 105 and 105 composed of Co—Pt are provided on both sides of the composite, and electrode layers 106 and 106 are provided thereon.

In the configuration shown in FIG. 15, a relatively large biasing magnetic field is required for fixation of the magnetization vector in the pinned ferromagnetic layer 103 in the Z direction. A higher biasing magnetic field is preferred. The biasing magnetic field must be at least 100 Oe to overcome the demagnetizing field in the Z direction and to prevent perturbation of the magnetization vector by the magnetic flux from a recording medium. As the biasing magnetic field, an anisotropic exchange coupling magnetic field is used, which is formed by contact of the pinned ferromagnetic layer 103 with the antiferromagnetic layer 104.

In the configuration shown in FIG. 15, the magnet layers 105 and 105 apply a longitudinal bias that is parallel to the free ferromagnetic layer 101 so that the magnetization vector is oriented in the track direction, while a bias is applied in the Z direction perpendicular to the magnetization vector in the free ferromagnetic layer 101 so that the magnetization vector in the pinned ferromagnetic layer 103 is oriented in the Z direction. The longitudinal bias can reduce Barkhausen noise which is caused by the formation of many magnetic domains in the free ferromagnetic layer 101. Thus, the resistance smoothly changes in response to the magnetic flux from the magnetic recording medium with reduced noise.

The magnetization vector in the pinned ferromagnetic layer 103 must not change by a magnetic flux (in the Z direction in FIG. 15) from the magnetic recording medium, whereas the vector in the free ferromagnetic layer 101 changes within 90±θ° with respect to the magnetization vector in the pinned ferromagnetic layer 103. The linear responsiveness of the magnetoresistive effects is achieved in such a manner.

As described above, a spin-valve MR head having excellent linear responsiveness and reduced Barkhausen noise is achieved by using a bias of the pinned ferromagnetic layer, a longitudinal bias of the free ferromagnetic layer, and an anisotropic exchange coupling magnetic field which is generated at the interface between the ferromagnetic layer 103 and the antiferromagnetic layer 104.

The reading head $h_1$ may use the MR element instead of the MI elements shown in FIGS. 12 and 14.

Figure 16:
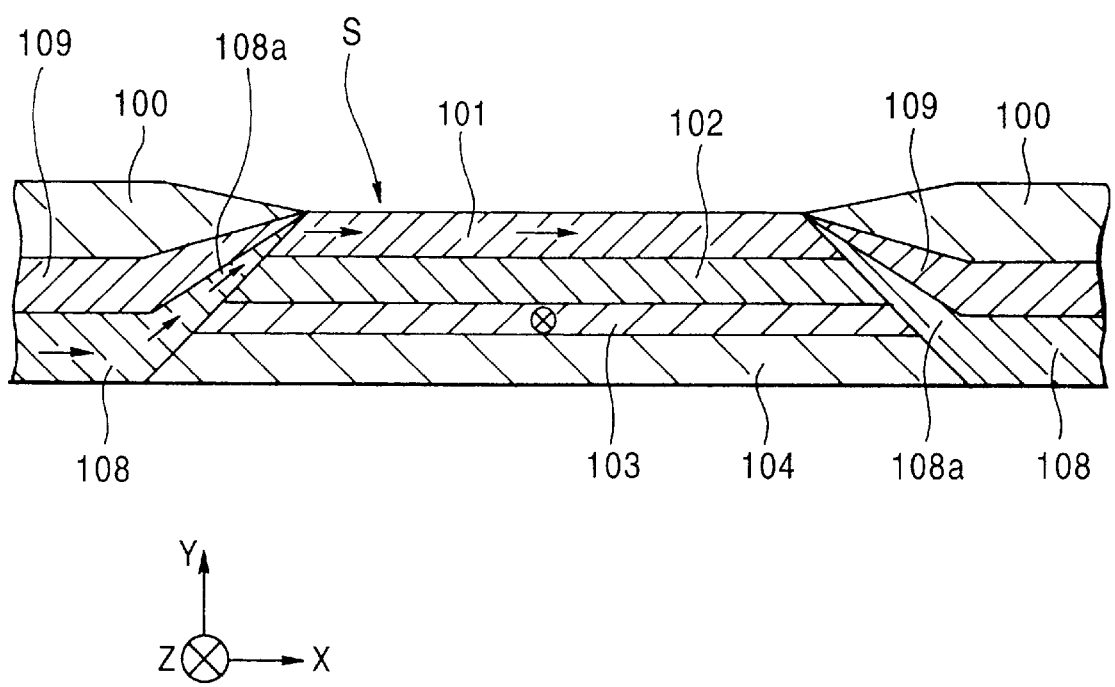
FIG. 16 is a cross-sectional view of another embodiment of a MI element for forming a reading head.

FIG. 16 shows another embodiment of the MR element. A composite layer S including a free ferromagnetic layer 101, a nonmagnetic interlayer 102, a pinned ferromagnetic layer 103 and an antiferromagnetic layer 104 is interposed between ferromagnetic layers 108 composed of, for example, Ni—Fe. An antiferromagnetic layer 109 and an electrode layer 100 are deposited on each ferromagnetic layer 108.

Unidirectional anisotropy of the antiferromagnetic layer 109 puts the ferromagnetic layer 108 into a single domain. Thus, a magnetic flux is applied to the free ferromagnetic layer 101 from the extension 108a of the ferromagnetic layer 108 being in contact with the composite layer S, and a longitudinal bias is applied to the free ferromagnetic layer 101 by magnetic exchange coupling.

Since the MR element shown in FIG. 16 also shows a change in resistance in response to the leakage magnetic field from a magnetic recording medium, it can be used in the reading head $h_1$.

An azimuth sensor using the MI element will now be described.

Figure 17:
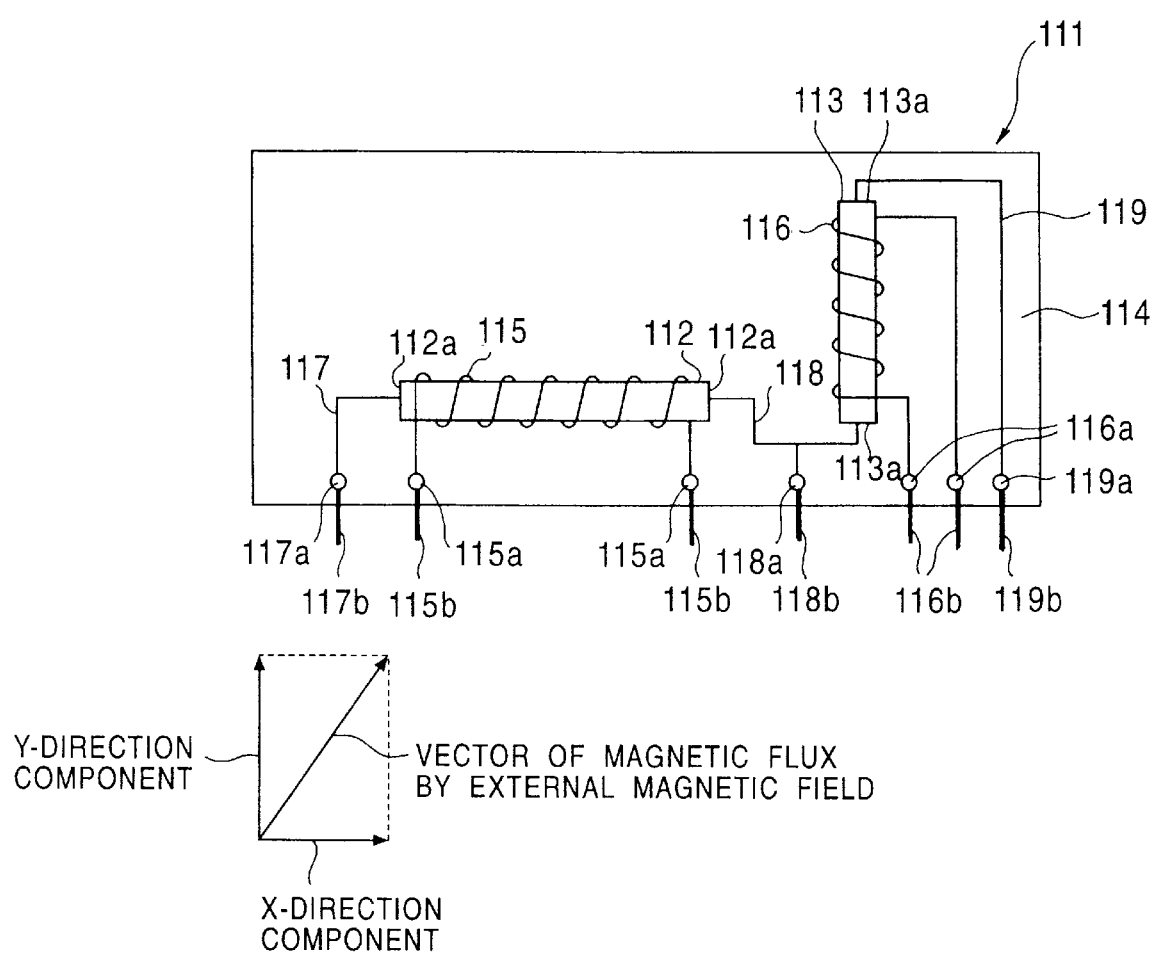
FIG. 17 is a plan view of an azimuth sensor in accordance with the present invention.

With reference to FIG. 17, an azimuth sensor 111 has a first MI element 112 as a detecting means for the component in the X axis of an external magnetic field, and a second MI element 113 as a detecting means for the component in the Y axis, perpendicular to the X axis, of the external magnetic field.

The first and second MI elements 112 and 113 are composed of a soft magnetic glassy alloy containing at least one metal selected from the group consisting of Fe, Co and Ni as a primary component. These elements have a planar rectangular shape with a given thickness.

The first and second MI elements 112 and 113 are arranged in a plane 114 such that the directions of the alternating current paths in these elements are perpendicular to each other. In other words, the longitudinal directions of the first and second MI elements 112 and 113 are perpendicular to each other. These elements are fixed onto the plane 114 by any fixation means.

The first and second MI elements 112 and 113 are not limited to the plate shown in FIG. 17, and may be a rod, a ribbon, a wire, a line or a plurality of twisted wires or lines.

Coils 115 and 116 are wound around the longitudinal directions of the first and second MI elements 112 and 113, respectively, in order to apply biasing magnetization along the alternating current paths applied to the first and second MI elements 112 and 113. Both ends of the coils 115 and 116 are connected to external leads 115b and 116b, respectively, with coil terminals 115a and 116b, respectively, therebetween. Both longitudinal ends 112a and 112b, respectively, of the first and second MI elements 112 and 113 are connected to output leads 117, 118 and 119, respectively, for extracting the output current. The output leads 117 and 119 are connected to external output leads 117b and 119b, respectively, with output terminals 117a and 119a, respectively, therebetween. Both ends of the output lead 118 are connected to the terminal 112a of the first MI element 112 and the terminal 113a of the second MI element 113. The output lead 118 is also connected to an external output lead 118b with an output terminal 118 therebetween. In addition, both ends 112a and 113a of the first and second MI elements 112 and 113, respectively, are connected to leads (not shown in the drawing) for applying an alternating current.

The operation of the azimuth sensor is as follows. In FIG. 17, an alternating current of a MHz band is applied to the first and second MI elements 112 and 113 through leads not shown in the drawing. A voltage by the impedance inherent in the element is generated between both ends 112a or 113a of each of the first and second MI elements 112 and 113. When a magnetic flux by an external magnetic field having a given vector is applied to the first MI element 112, the impedance between both ends 112a of the first MI element 112 corresponds to a component of the magnetic flux parallel to the longitudinal direction of the first MI element 112 (an X-axis component). Similarly, when the magnetic flux is applied to the second MI element 113, the impedance between both ends 113a of the second MI element 113 corresponds to a component of the magnetic flux parallel to the longitudinal direction of the second MI element 113 (a Y-axis component). Thus, when the vector of the magnetic flux by the external magnetic field changes to the first and second MI elements 112 and 113, the impedances of the first and second MI elements 112 and 113 change and thus the output voltages from the first and second MI elements 112 and 113 change.

Accordingly, the azimuth sensor 111 generates an output current corresponding to the output voltage in response to the X-axis component of the geomagnetism through the output terminals 117a and 118a and an output current corresponding to the output voltage in response to the Y-axis component of the geomagnetism through the output terminals 119a and 118a. These output currents are fed into a processing section not shown in the drawing through the external output leads 117b, 118b and 119b. The processing section determines the direction of the magnetic flux by the geomagnetism based on the output currents.

The MI element in accordance with the present invention can detect a magnetism of approximately $10^{-5}$ Oe, whereas conventional MR elements have a sensitivity of approximately 0.1 Oe. When an alternating current of several to several tens MHz is applied to the first and second MI elements 112 and 113 which are connected to a self-oscillator such as a Colpitts oscillator, the sensor can detect a very weak external magnetic field with a resolution of approximately $10^{-6}$. Since the sensitivity for the magnetic detection is satisfactorily high even when the impedance of the first and second MI elements 112 and 113 are reduced by their length reduction, the azimuth sensor 111 can be miniaturized.

As described above, the azimuth sensor 111 has coils 115 and 116 for applying a biasing magnetization to the first and second MI elements 112 and 113. These MI elements show a change in the output voltage or impedance with the absolute value and an external magnetic field, and the change is symmetrical with respect to an external magnetic field of zero.

Figure 18A:
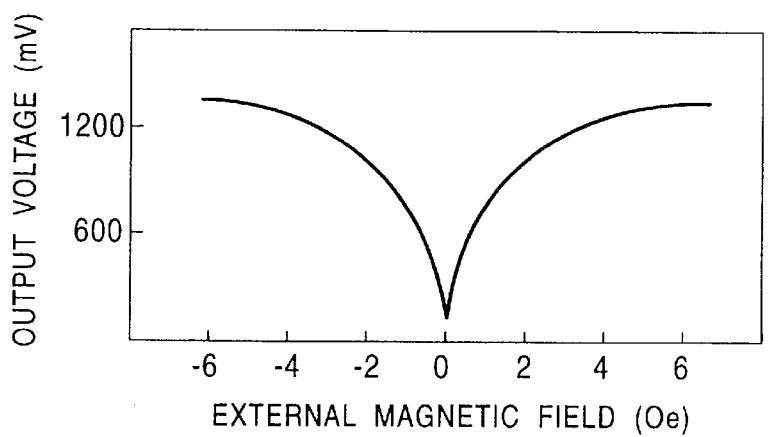
FIGS. 18A to 18C are graphs illustrating the relationship between the external magnetic field and the output voltage in an azimuth sensor in accordance with the present invention.
Figure 18B:
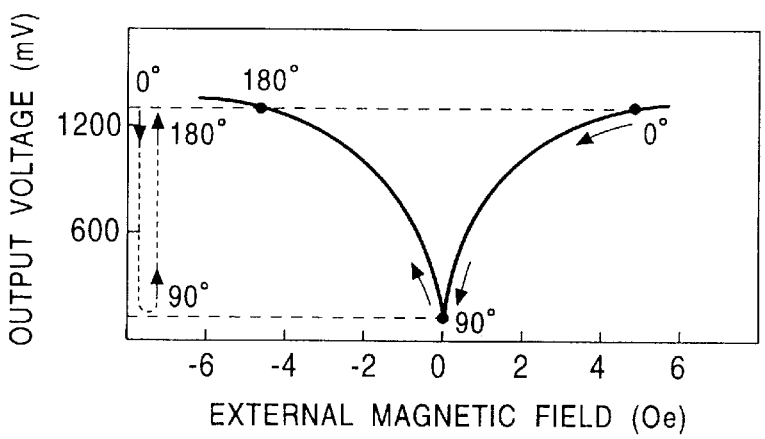

When a biasing magnetization is not applied to the first and second MI elements 112 and 113, as shown in FIG. 18B, the output voltage from the first MI element 112 decreases as the direction of the magnetic flux by the external magnetic field is changed from 0° to 90° to the longitudinal direction of the first MI element 112. The output voltage from the first MI element 112 increases as the direction of the magnetic flux by the external magnetic field is changed from 90° to 180°. Since the output voltages for 0° and 180°0 are the same, the direction of the magnetic flux cannot be exactly determined.

Figure 18C:
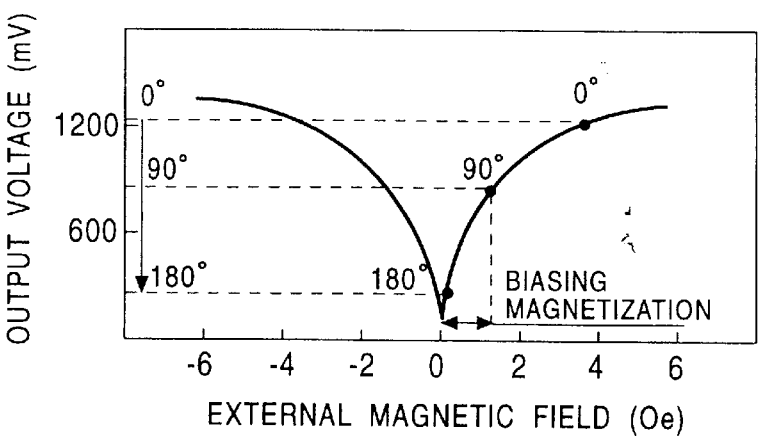

In contrast, when a biasing magnetization is applied to the first and second MI elements 112 and 113, as shown in FIG. 18C, the impedance linearly changes within a range of the direction in the external magnetic field from 0° to 180°. Thus, the direction of the external magnetic field can be exactly determined.

It is preferable that the absolute value of the biasing magnetization applied to the first and second MI elements 112 and 113 lies in a range of 0.1 to 2 Oe. For a biasing magnetization out of the range, the impedance does not show a linear change with the external magnetic field. As a result, a direct biasing current of several mA is applied to the coils 115 and 116 for applying the biasing magnetization.

Since the glassy alloy which is used as the first and second MI elements 112 and 113 can be formed by slow cooling, relatively thick ribbons and wires can be produced.

MI elements having various shapes, such as a bulk, a ribbon, and a wire can be produced from a melt of the soft magnetic glassy alloy in accordance with the present invention by a casting process, or a single- or twin-roll quenching process. The resulting elements have a thickness and a size which are ten times larger than those of conventional amorphous alloys. Accordingly, an azimuth sensor having a desired shape can be readily designed and produced by using the MI elements in accordance with the present invention having high possibility of the shape.

The soft magnetic glassy alloy in accordance with the present invention has soft magnetism at room temperatures and these characteristics are further improved by heat treatment as described above. Thus, the glassy alloy is preferably applied to the azimuth sensor with reduced production costs.

The first and second MI elements 112 and 113 have a moderate change in the output voltage within a very weak external magnetic field of −2 Oe to +2 Oe. Since such a change is linear and quantitative, the azimuth sensor 111 having the above-described configuration can exactly determine the direction of the magnetic flux by the geomagnetism. Further, a circuit having a simplified configuration can process the output voltage, resulting in production cost reduction of the azimuth sensor 111. Since the biasing magnetization is small, that is, at most 2 Oe, a circuit for applying a biasing magnetization has a simple configuration.

The magneto-impedance effects of the soft magnetic glassy alloy in accordance with the present invention used in the first and second MI elements 112 and 113 are further improved by heat treatment at 427° C. to 627° C. Thus, the azimuth sensor 111 can more exactly detect a very weak magnetic field such as geomagnetism.

Figure 19:
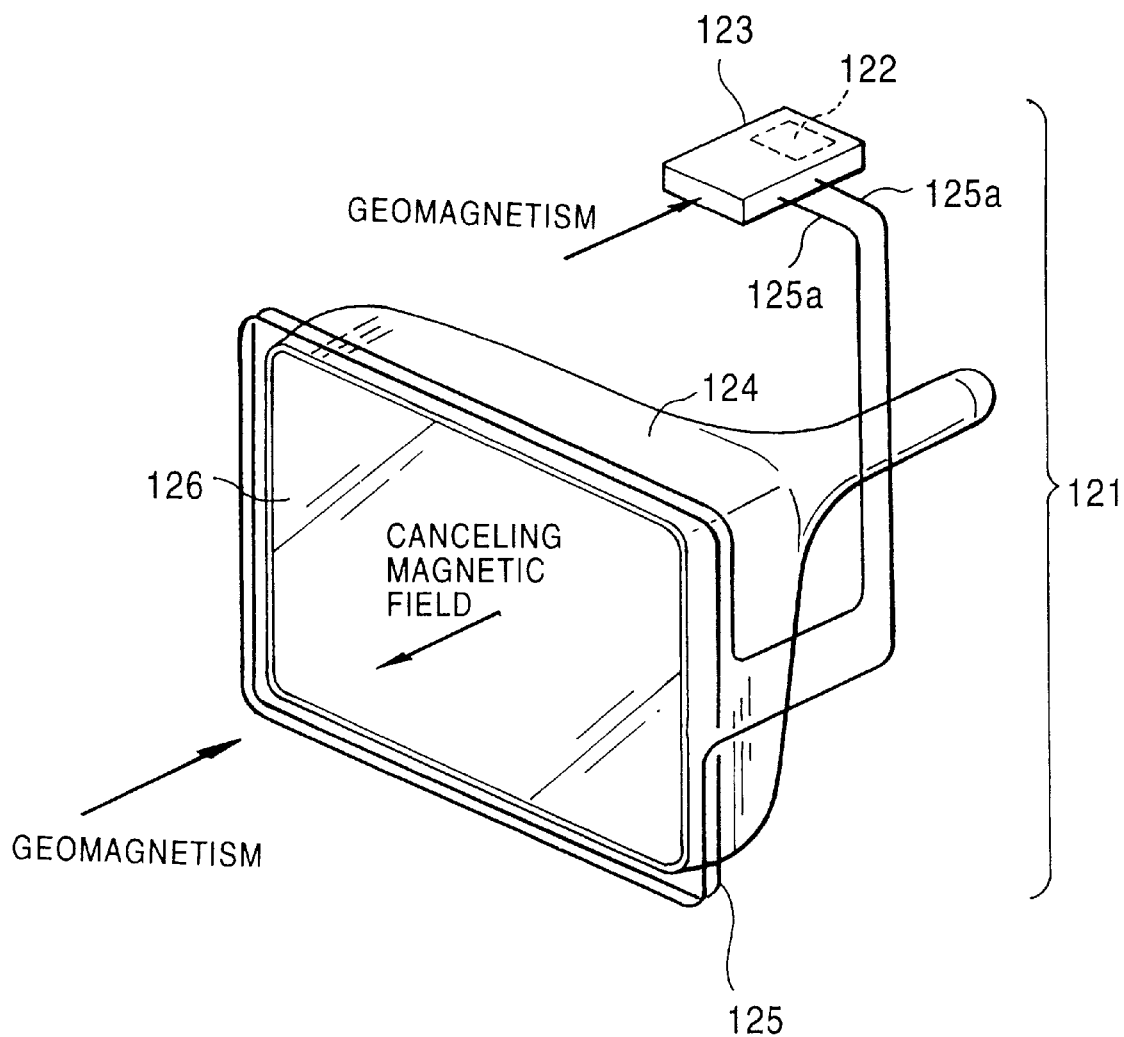
FIG. 19 is an isometric view of an autocanceler in accordance with the present invention.
Figure 20:
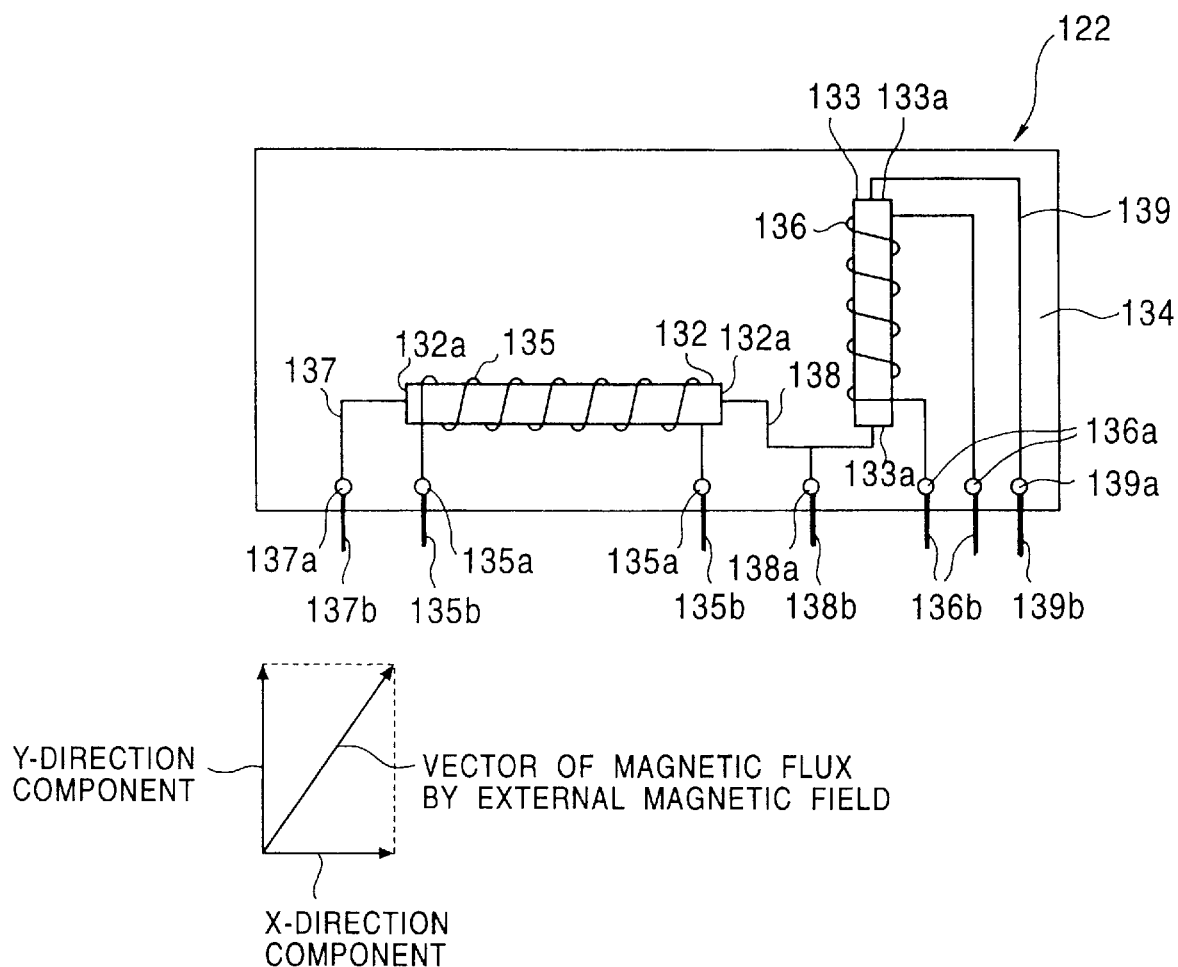
FIG. 20 is a plan view of a magnetic sensor of an autocanceler in accordance with the present invention.

An autocanceler using the MI element in accordance with the present invention will now be described. With reference to FIGS. 19 and 20, an autocanceler 121 has a canceling coil 125 wound around a face (a screen) of a CRT 124, and a controller 123. The canceling coil 125 applies a canceling magnetic field having the reverse vector to the magnetic flux of an external magnetic field to the CRT 124. The controller 123 controls the magnitude of the canceling magnetic field based on the direction of the magnetic flux by the external magnetic field. Both ends 125a of the canceling coil 125 are connected to the controller 123.

In FIG. 20, the magnetic sensor 122 has a first MI element 132 for detecting the X-axis component of the external magnetic field and a second MI element 133 for detecting the Y-axis component, perpendicular to the X axis, of the external magnetic field.

The first and second MI elements 132 and 133 are composed of a soft magnetic glassy alloy composed of at least one metal selected from the group consisting of Fe, Co and Ni as the primary component, and have a planar rectangular shape with a given thickness. The first and second MI elements are arranged in a common plane so that the alternating current paths applied to these elements are perpendicular to each other. That is, the longitudinal directions of the first and second MI elements 132 and 133 are perpendicular to each other. The shape of the first and second MI elements 132 and 133 is not limited to the above-mentioned plate, and may be a rod, a ribbon, a wire, a line, or a plurality of twisted wires.

Coils 135 and 136 are wound around the first and second MI elements 132 and 133 in the alternating current paths, that is, in the longitudinal direction. A biasing magnetization is applied to the first and second MI elements through the coils 135 and 136. Both ends of the coils 135 and 136 are connected to external leads 135b and 136b with coil terminals 135a and 136a therebetween. Both ends in the longitudinal direction of the first and second MI elements 132 and 133 are connected to output leads 137, 138 and 139 for extracting output currents. Output leads 137 and 139 are connected to external output leads 137b and 139b with output terminals 137a and 139 therebetween. Both ends of the output lead 138 are connected to the end 132a of the first MI element 132 and the end 133a of the second MI element 133, respectively. The output lead 138 is also connected to an external output lead 138b with an external terminal 138a therebetween. Both ends 132a and 133a in the longitudinal direction of the first and second MI elements 132 and 133 are connected to leads (not shown in the drawing) for applying an alternating current.

The operation of the autocanceler is as follows. In FIG. 20, an alternating current of a MHz band is applied to the first and second MI elements 132 and 133 though leads not shown in the drawing. A voltage by the impedance inherent in the element is generated between both ends 132a or 133a of each of the first and second MI elements 132 and 133. When a magnetic flux by an external magnetic field having a given vector, such as geomagnetism, is applied to the first MI element 132, the impedance between both ends 132a of the first MI element 132 corresponds to a component of the magnetic flux parallel to the longitudinal direction of the first MI element 132 (an X-axis component). Similarly, when the magnetic flux is applied to the second MI element 133, the impedance between both ends 133a of the second MI element 133 corresponds to a component of the magnetic flux parallel to the longitudinal direction of the second MI element 133 (a Y-axis component). Thus, when the vector of the magnetic flux by the external magnetic field changes to the first and second MI elements 132 and 133, the impedances of the first and second MI elements 132 and 133 change and thus the output voltages from the first and second MI elements 132 and 133 change.

Accordingly, the autocanceler 122 generates an output current corresponding to the output voltage in response to the X-axis component of the geomagnetism through the output terminals 137a and 138a and an output current corresponding to the output voltage in response to the Y-axis component of the geomagnetism through the output terminals 139a and 138a. These output currents are fed into a processing section not shown in the drawing through the external output leads 137b, 138b and 139b. The processing section determines the direction of the magnetic flux by the geomagnetism based on the output currents.

Since the geomagnetism is almost the same over the earth, the controller 123 determines the component of the magnetic flux of the geomagnetism in the vertical direction of the face or screen of the CRT based on the direction of the magnetic flux which is detected by the magnetic sensor 122. A current corresponding to the component is applied to the canceling coil 125 through the controller 123 so as to generate a canceling magnetic field having the reverse vector to the magnetic flux of the geomagnetism. Thus, the magnetic flux by the geomagnetism is cancelled. Since electron beams in the CRT 124 are prevented from perturbation, distorted images and irregular color distribution caused by the external magnetic field are prevented.

The MI element in accordance with the present invention can detect a magnetic field of approximately $10^{-5}$ Oe, whereas conventional MR elements have a magnetic sensitivity of approximately 0.1 Oe. When an alternating current of several to several tens MHz is applied to the first and second MI elements 132 and 133 which are connected to a self-oscillator such as a Colpitts oscillator, the sensor can detect a very weak external magnetic field with a resolution of approximately $10^{-6}$. Since the sensitivity for the magnetic detection is satisfactorily high even when the impedance of the first and second MI elements 132 and 133 are reduced by their length reduction, the autocanceler 121 can be miniaturized.

As described above, the magnetic sensor 122 of the autocanceler 121 has coils 135 and 136 for applying a biasing magnetization to the first and second MI elements 132 and 133. These MI elements show a change in the output voltage or impedance with the absolute value and an external magnetic field, and the change is symmetrical with respect to an external magnetic field of zero, as shown in FIG. 2.

When a biasing magnetization is not applied to the first and second MI elements 132 and 133, as shown in FIG. 18B, the output voltage from the first MI element 132 decreases as the direction of the magnetic flux by the external magnetic field is changed from 0° to 90° to the longitudinal direction of the first MI element 132. The output voltage from the first MI element 132 increases as the direction of the magnetic flux by the external magnetic field is changed from 90° to 180°. Since the output voltages for 0° and 180° are the same, the direction of the magnetic flux cannot be exactly determined.

In contrast, when a biasing magnetization is applied to the first and second MI elements 132 and 133, as shown in FIG. 18C, the impedance changes linearly within a range of the direction in the external magnetic field from 0° to 180°. Thus, the direction of the external magnetic field can be exactly determined.

It is preferable that the absolute value of the biasing magnetization applied to the first and second MI elements 132 and 133 lies in a range of 0.1 to 2 Oe. For a biasing magnetization out of the range, the impedance does not show a linear change with the external magnetic field. As a result, a direct biasing current of several mA is applied to the coils 135 and 136 for applying the biasing magnetization.

Since the glassy alloy which is used as the first and second MI elements 132 and 133 can be formed by slow cooling, relatively thick ribbons and wires can be produced.

MI elements having various shapes, such as a bulk, a ribbon, and a wire can be produced from a melt of the soft magnetic glassy alloy in accordance with the present invention by a casting process, a single- or twin-roll quenching process, a liquid spinning process or a solution extraction process. The resulting elements have a thickness and a size which are ten times larger than those of conventional amorphous alloys. Accordingly, an autocanceler having a desired shape can be readily designed and produced with reduced production costs by using the MI elements in accordance with the present invention having high possibility of the shape.

The soft magnetic glassy alloy in accordance with the present invention has soft magnetism at room temperature, and these characteristics are further improved by heat treatment at a temperature of 427° C. to 627° C. Thus, the heat-treated glassy alloy is more suitable for the autocanceler.

The MI element used in the magnetic sensor of the autocanceler is composed of a glassy alloy containing at least one main component selected from the group consisting of Fe, Co and Ni, at least one element selected from the group consisting of Zr, Nb, Ta, Hf, Mo, Ti and V, and B. The glassy alloy has a temperature range of the supercooling liquid $\Delta T_x$, which is represented by the formula $\Delta T_x = T_x - T_g$ where $T_x$ is the crystallization temperature and $T_g$ is the glass transition temperature. The MI element has a large change in impedance to an external magnetic field and thus can detect a very weak magnetic field such as geomagnetism. Since the MI element has high sensitivity to the external magnetic field, the MI element and thus the autocanceler can be miniaturized.

The first and second MI elements 132 and 133 have a moderate change in the output voltage within a very weak external magnetic field of −2 Oe to +2 Oe. Since such a change is linear and quantitative, the autocanceler 121 having the above-described configuration can exactly determine the direction of the magnetic flux by the geomagnetism. Further, a circuit having a simplified configuration can process the output voltage, resulting in production cost reduction of the autocanceler 121. Since the biasing magnetization is small, that is, at most 2 Oe, a circuit for applying a biasing magnetization has a simple configuration.

The magneto-impedance effects of the soft magnetic glassy alloy in accordance with the present invention used in the first and second MI elements 132 and 133 are further improved by heat treatment at 427° C. to 627° C. Thus, the autocanceler 121 can more exactly detect a very weak magnetic field such as a geomagnetism.

While a preferred embodiment has been described, variations thereto will occur to those skilled in the art within the scope of the present inventive concepts. For example, A MIG magnetic head has been described above, but a magnetic head having a magnetic gap free of a magnetic metal film may be used.

The MI element in accordance with the present invention having excellent characteristics can be applied to very weak magnetic field sensors, current sensors wit h high-speed responsiveness, flux gate sensors, potentiometers, rotary encoder heads, electronic compasses, tablets, magnetic defect search heads, magnetic cards, magnetic ticket heads, magnetic proximity switches, magnetic brush memories, magnetic neurons, antenna cores, and magnetic fluid monitors for medical use.

EXAMPLES

Example 1

Production of MI Element

Powders of Fe, Co, Ni, Zr, Nb an d B were mixed such that the mixture had a composition by molar ratio of $Fe_{56}Co_7Ni_7Zr_6Nb_4B_{20}$. The mixture was melted in an arc-melting furnace in an argon atmosphere with a reduced pressure to form an ingot. The ingot was melted in a crucible by microwave induction heating, and the melt was brought into contact with a rotating cooling roll having a sharp edge in an argon atmosphere with a reduced pressure to extract. The melt was solidified and a ribbon was obtained. The process was referred to as a liquid spinning process. A sample having a length of 6 mm as a MI element of Example 1 was prepared from the ribbon.

Measurement of MI effects

Figure 26:
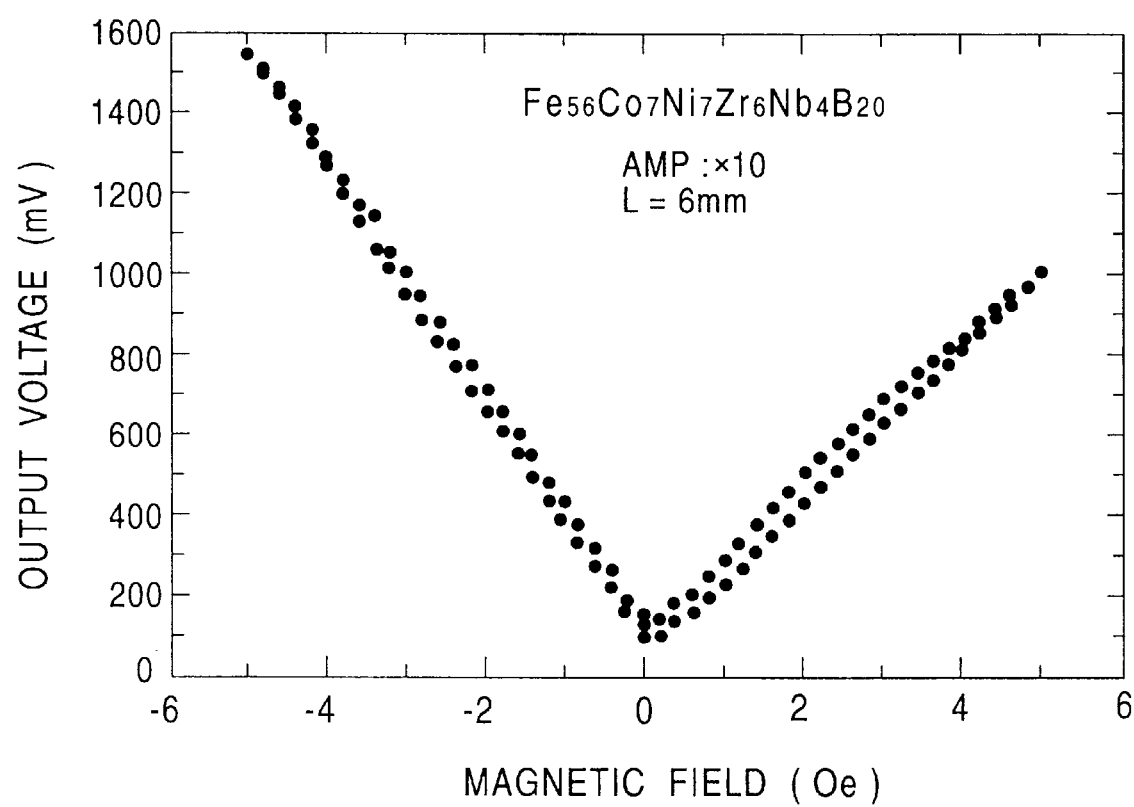
FIG. 26 is a graph illustrating the relationship between the external magnetic field and the output voltage in the MI element of Example 6.

The MI element was assembled into the magnetic sensing circuit shown in FIG. 13. An alternating current of 3 MHz was applied, while an external magnetic field Hex is applied to the MI element in the longitudinal direction. Output voltages were measured for various external magnetic fields Hex. The external magnetic field Hex was continuously changed from 0 Oe to 5 Oe, 0 Oe, −5 Oe and then 0 Oe. Amplification was ten times. The results are shown in FIG. 26. The MI element shows high sensitivity and linearity over a very weak magnetic field region of −2 Oe to +2 Oe, and very slight hysteresis.

Example 2

Pure Fe, Co, Ni, Zr Nb metals and pure boron were mixed and melted by arc melting in an argon atmosphere to form a mother alloy. The mother alloy was melted in a crucible. The melt was sprayed onto a copper roll rotating at a rate of 40 m/S in an argon atmosphere through a nozzle with a diameter of 0.4 mm lying at the bottom of the crucible under an injection pressure of $0.39 \times 10^5$ Pa (a single roll process). A glassy alloy ribbon having a width of 0.4 to 1 mm and a thickness of 13 to 22 $\mu$m was prepared. The resulting glassy alloy was analyzed by differential scanning calorimetry (DSC). Four glassy alloys having different compositions were prepared in such a manner.

Figure 21:
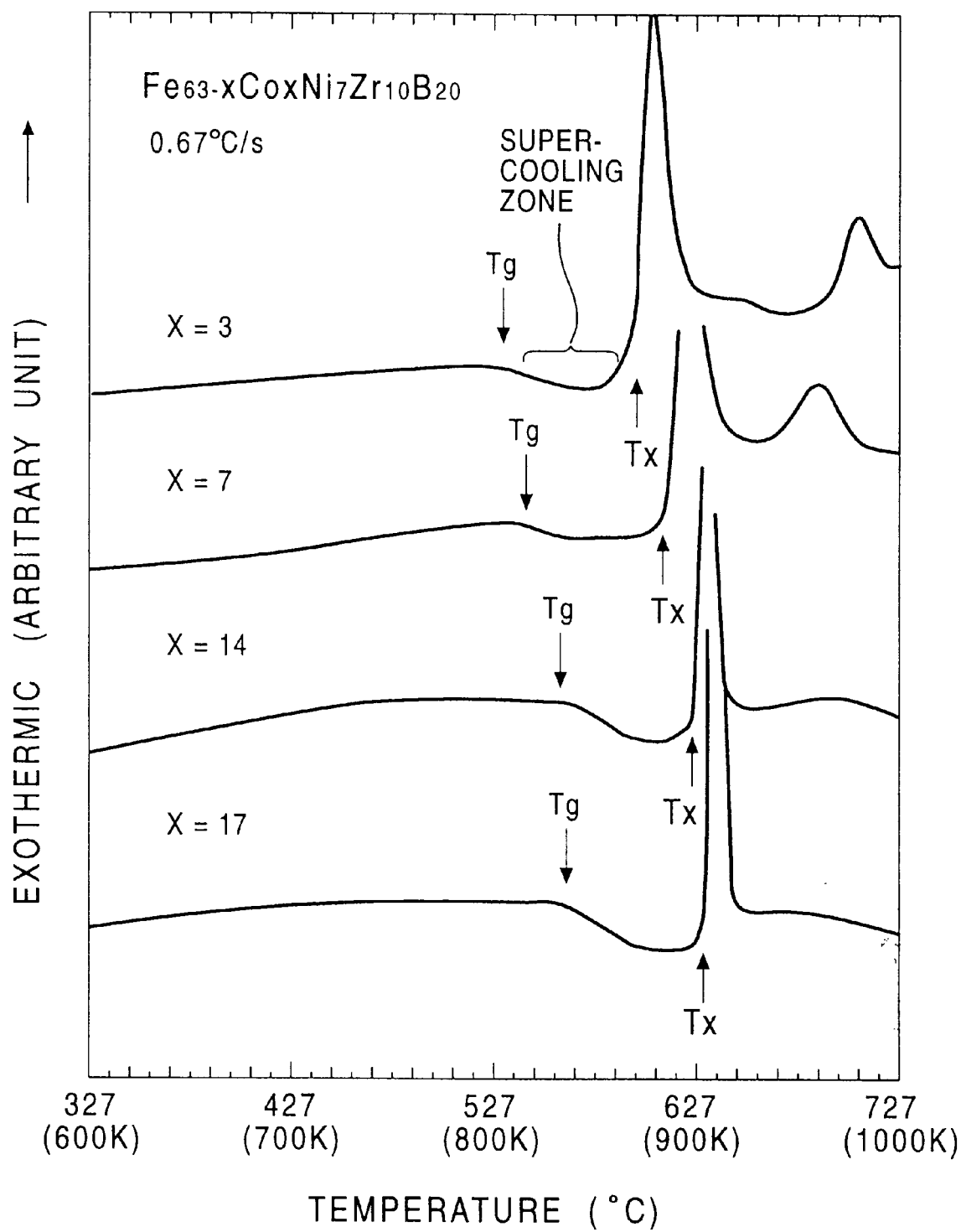
FIG. 21 includes DSC thermograms of thin film glassy alloys having the compositions of $Fe_{60}Co_3Ni_7Zr_{10}B_{20}$, $Fe_{56}Co_7Ni_7Zr_{10}B_{20}$, $Fe_{46}Co_{17}Ni_7Zr_{10}B_{20}$, and $Fe_{46}Co_{17}Ni_7Zr_{10}B_{20}$.
Figure 22:
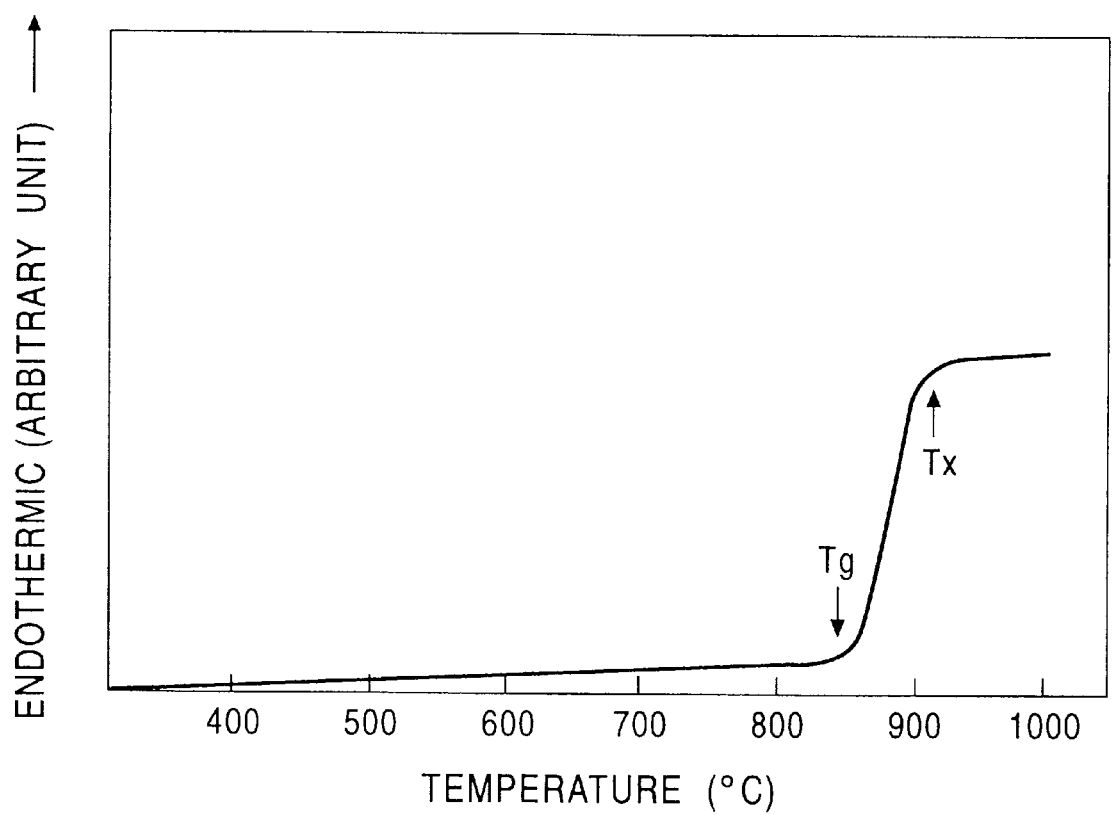
FIG. 22 is a DSC thermogram of a thin film glassy alloy having a composition of $Fe_{56}Co_7Ni_7Zr_8Nb_2B_{20}$.

FIG. 21 includes DSC thermograms of glassy alloys having the compositions of $Fe_{60}Co_3Ni_7Zr_{10}B_{20}$, $Fe_{56}Co_7Ni_7Zr_{10}B_{20}$, $Fe_{49}CO_{14}Ni_7Zr_{10}B_{20}$, and $Fe_{46}Co_{17}Ni_7Zr_{10}B_{20}$. FIG. 22 is a DSC thermogram of a glassy alloy ribbon having a composition of $Fe_{56}Co_7Ni_7Zr8Nb_2B_{20}$. Each thermogram demonstrates that each glassy alloy has a wide supercooling liquid zone in the heating process and is crystallized by heating to a temperature which is higher than the supercooling liquid zone. The temperature range of the supercooling liquid $\Delta T_x$ ($=T_x-T_g$) is greater than 60° C. for all the glassy alloys shown in FIG. 21. A substantial equilibrium state showing the supercooling liquid zone was achieved in a temperature range which is slightly lower than the crystallization temperature confirmed by the exothermic peak, that is, from 596° C. (869 K) to 632° C. (905 K).

Figure 23:
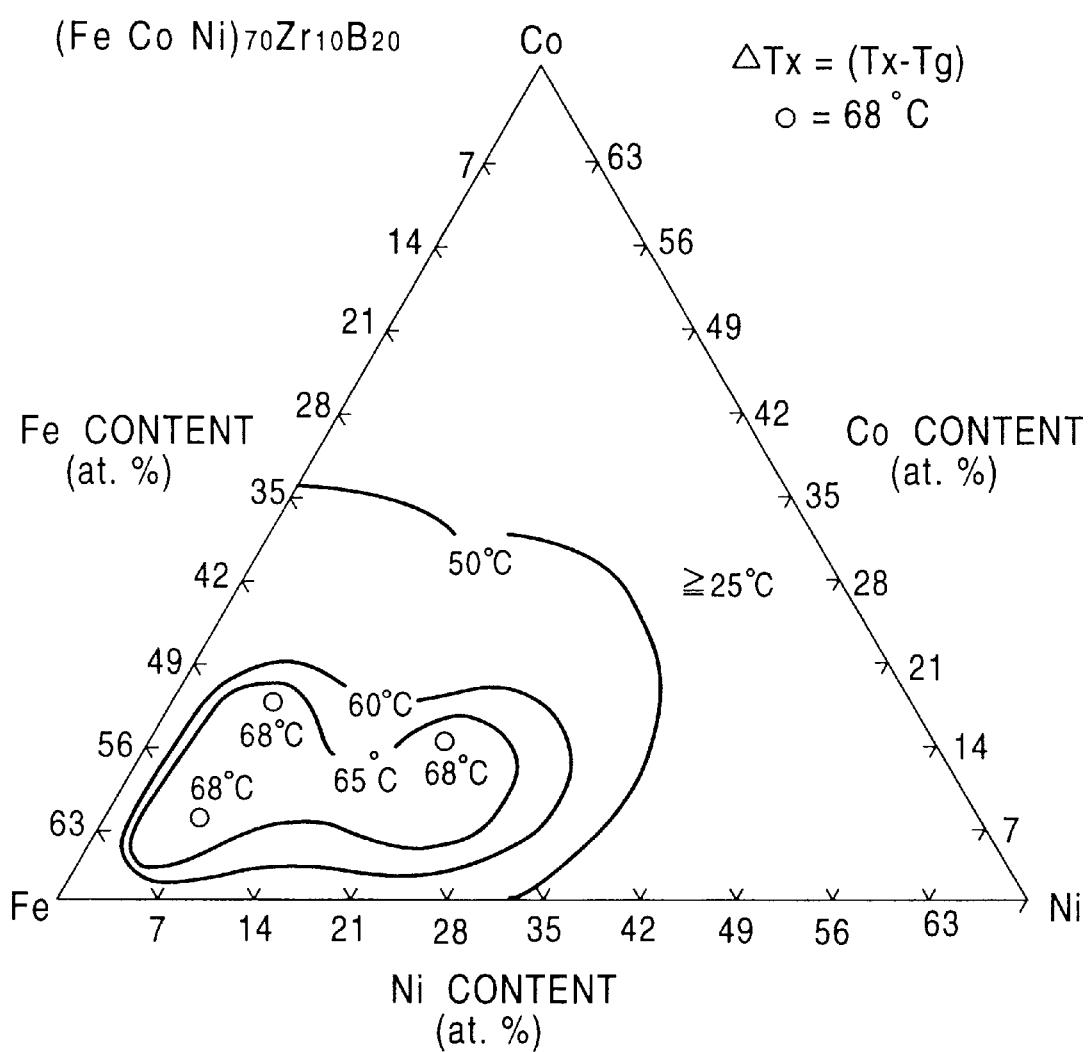
FIG. 23 is a ternary diagram illustrating dependence of $\Delta T_x (=T_x-T_g)$ on Fe, Co and Ni contents in a composition of $(Fe_{1-a-b-c}Co_aNi_b)_{70}Zr_{10}B_{20}$.

FIG. 23 is a ternary diagram showing the dependence of $\Delta T_x (=T_x-T_g)$ on the Fe, Co and Ni contents in the composition of $(Fe_{1-a-b}Co_aNi_b)_{70}M_{10}B_{20}$. FIG. 23 demonstrates that $\Delta T_x$ is larger than 25° C. over the entire range of the composition of $(Fe_{1-a-b}Co_aNi_b)_{70}M_{10}B_{20}$. The compositions having greater Fe contents have higher $\Delta T_x$. In order to achieve a $\Delta T_x$ of 60° C. or more, 3 atomic percent or more and 20 atomic percent or less of Co, and 3 atomic percent or more and 30 atomic percent or less of Ni are contained.

In the composition of $(Fe_{1-a-b}Co_aNi_b)_{70}M_{10}B_{20}$, the suffix a representing the Co ratio is 0.042 or more for a Co content of 3 atomic percent or more, and 0.29 or less for a Co content of 20 atomic percent or less, since $(Fe_{1-a-b}Co_aNi_b)$ is 70 atomic percent. Similarly, the suffix b representing the Ni ratio is 0.042 or more for a Ni content of 3 atomic percent or more, and 0.43 or less for a No content of 30 atomic percent or less.

Example 3

Figure 24:
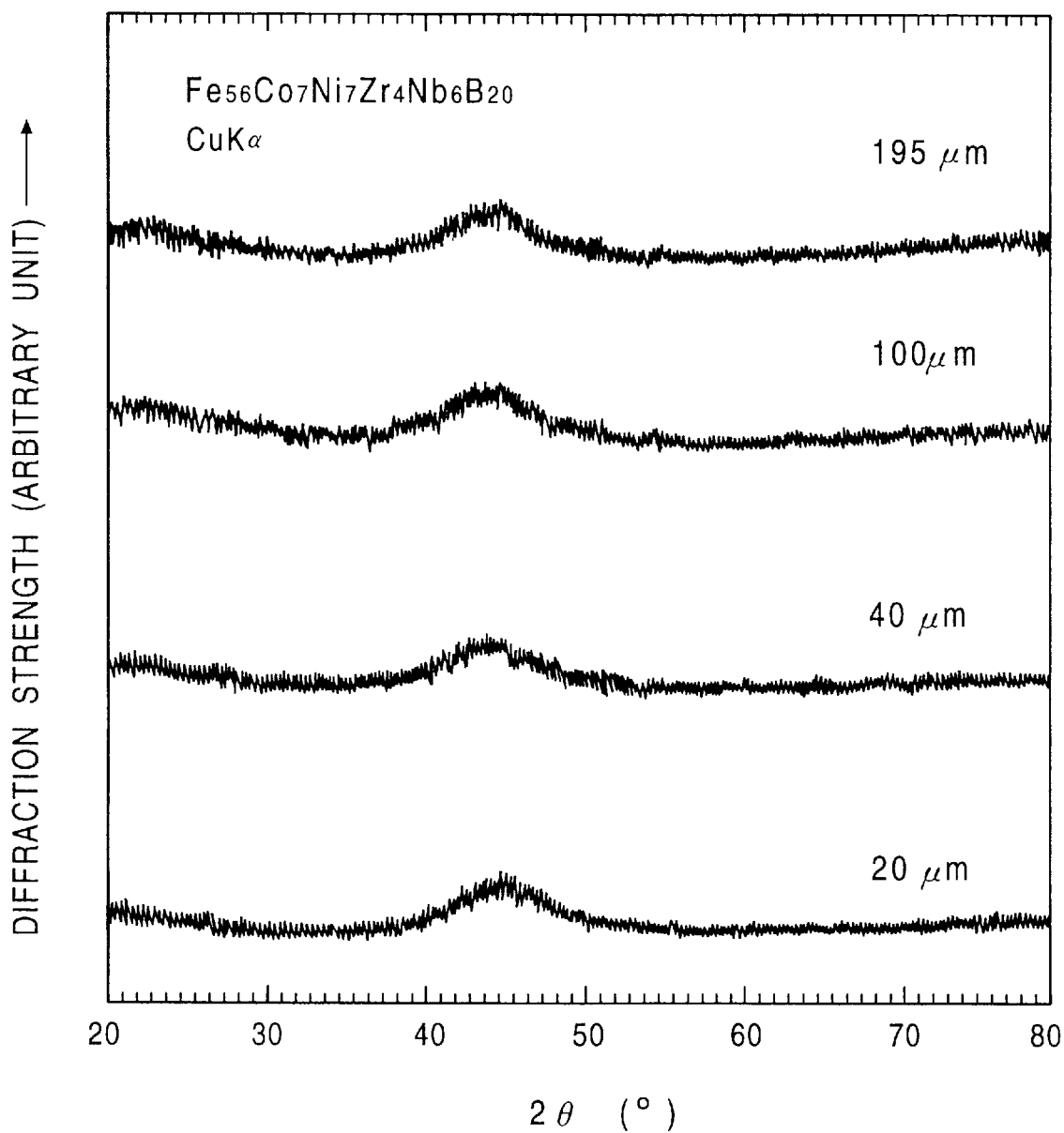
FIG. 24 includes X-ray diffraction patterns at various thicknesses of a thin film glassy alloy having a composition of $Fe_{56}Co_7Ni_7Zr_4Nb_6B_{20}$.

Quenched alloy ribbons having a composition of $Fe_{56}Co_7Ni_7Zr_4Nb_6B_{20}$ and different thickness of 20 to 195$\mu$m were prepared as in Example 2. The thickness was controlled by adjusting the nozzle diameter of the crucible, the distance or gap between the nozzle tip and the roll surface, rotation of the roll, the injection pressure, and the pressure of the atmospheric gas of the single roll process. The resulting quenched ribbons were analyzed by X-ray diffractometry. The results are shown in FIG. 24. FIG. 24 illustrates that ribbons having a thickness of 20 to 195 $\mu$m have a single amorphous phase which is confirmed by halo patterns at $2\theta=38$ to $52°$.

Example 4

Quenched alloy ribbons having compositions of $Fe_{64}Co_3Ni_3Zr_{10}B_{20}$, $Fe_{60}Co_3Ni_7Zr_{10}B_{20}$, $Fe_{56}Co_7Ni_7Zr_{10}B_{20}$, $Fe_{49}Co_{14}Ni_7Zr_{10}B_{20}$, and $Fe_{46}Co_{17}Ni_7Zr_{10}B_{20}$ were prepared as in Example 2. The saturation magnetic flux density (Bs), the coercive force (Hc) and the permeability ($\mu$e) at 1 kHz of the as-quenched alloy ribbons and the alloy ribbons annealed at 427° C. (700 K), 477° C. (750 K) and 527° C. (800 K) are shown as follows.

|          | As quenched | Annealed at 427° C. | Annealed at 477° C. | Annealed at 527° C. |
|----------|-------------|---------------------|---------------------|---------------------|
| $Fe_{64}Co_3Ni_3Zr_{10}B_{20}$ Alloy Ribbon | | | | |
| Bs       | 0.91        | 0.88                | 0.91                | 0.92                |
| Hc       | 3.4         | 2.9                 | 2.6                 | 2.0                 |
| μe       | 4,666       | 9,639               | 12,635              | 11,882              |
| $Fe_{60}Co_3Ni_7Zr_{10}B_{20}$ Alloy Ribbon | | | | |
| Bs       | 0.92        | 0.93                | 0.92                | 0.93                |
| Hc       | 2.7         | 2.1                 | 2.2                 | 1.7                 |
| μe       | 4,173       | 9,552               | 11,702              | 10,896              |
| $Fe_{56}Co_7Ni_7Zr_{10}B_{20}$ Alloy Ribbon | | | | |
| Bs       | 0.95        | 0.95                | 0.96                | 0.94                |
| Hc       | 6.1         | 2.88                | 2.41                | 3.06                |
| μe       | 5,100       | 14.260              | 17,659              | 8,121               |
| $Fe_{49}Co_{14}Ni_7Zr_{10}B_{20}$ Alloy Ribbon | | | | |
| Bs       | 0.94        | 0.93                | 0.93                | 0.93                |
| Hc       | 9.9         | 3.7                 | 3.37                | 5.526               |
| $Fe_{46}Co_{17}Ni_7Zr_{10}B_{20}$ Alloy Ribbon | | | | |
| Bs       | 0.96        | 0.95                | 0.95                | 0.96                |
| Hc       | 10.08       | 3.2                 | 3.3                 | 6.4                 |

These results suggest that soft magnetism is essential for excellent MI effects when the MI element is used for a magnetic head or an azimuth sensor and are achieved preferably by a Co content in a range of 3 atomic percent to 17 atomic percent, that is, $0.042 \leq a \leq 0.25$.

Example 5

Figure 25:
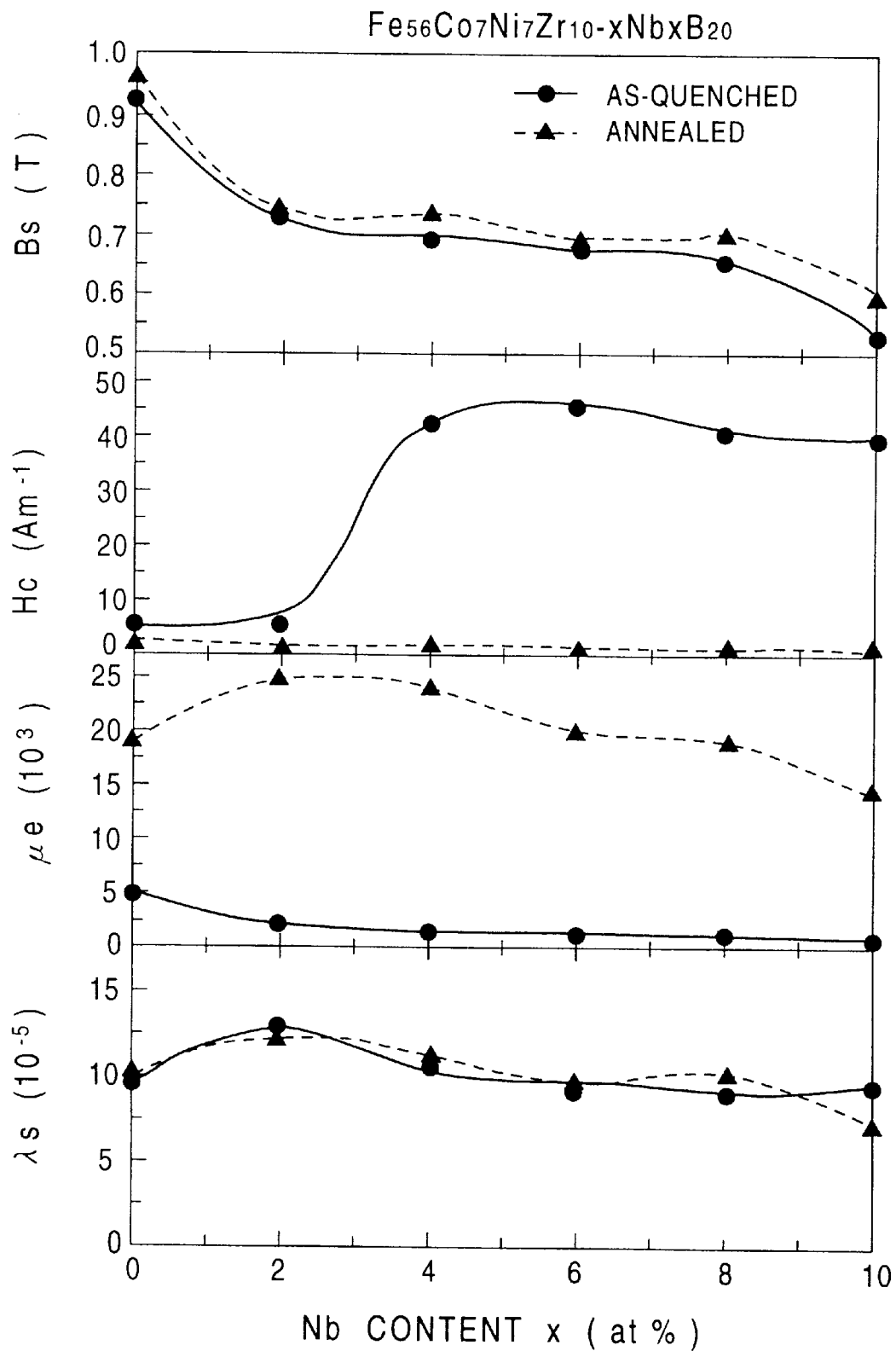
FIG. 25 includes graphs illustrating dependence of saturation magnetic flux density (Bs), coercive force (Hc), permeability at 1 kH ($\mu e$), and magnetostriction ($\lambda s$) on the Nb content in a glassy alloy having a composition of $Fe_{56}Co_7Ni_7Zr_{10-x}Nb_xB_{20}$, wherein X is 0, 2, 4, 6, 8, or 10 atomic percent.

Quenched alloy ribbons having compositions of $Fe_{56}Co_7Ni_7Zr_{10-x}Nb_xB_{20}$ (x=0, 2, 4, 6, 8, and 10 atomic percent) were prepared as in Example 2. The saturation magnetic flux density (Bs), the coercive force (Hc) and the permeability (μe) at 1 kHz of the as-quenched alloy ribbons and the alloy ribbons annealed at 527° C. (800 K) for 5 minutes are shown in FIG. 25.

The saturation magnetic flux density (Bs) decreases with an increased Nb content in the as-quenched and annealed alloy ribbons. The ribbons not containing Nb have a saturation magnetic flux density of 0.9 (T) or more, whereas the ribbons containing 2 atomic percent of Nb have a saturation magnetic flux density of approximately 0.75 (T).

The permeability (μe) of the as-quenched alloys decreases with an increased Nb percent, that is, 5,031 for Nb=0 atomic percent, 2,228 for Nb=2 atomic percent, or 906 for Nb=10 atomic percent. The permeability of the annealed alloys significantly improve, that is, approximately 2,500 for Nb=2 atomic percent.

The coercive force (Hc) of the as-quenched alloys is significantly low, that is, 5 A/m (=0.0625 Oe) for Nb=0 and 2 atomic percent, but is significantly increased, that is, 50 A/m (=0.625 Oe) for Nb≦4 atomic percent. In contrast, the annealed alloys have excellent coercive force (Hc) regardless of the Nb content.

Accordingly, the Nb content in this glassy alloy system preferably lies in a range of 0 to 2 atomic percent in order to excellent soft magnetism, that is, a large saturation magnetic flux density, a small coercive force, a high permeability. A magnetic head using a MI element composed of such a glassy alloy will high sensitivity. An azimuth sensor using this MI element will detect a very weak geomagnetism and thus will determine the direction more accurately. Also, an autocanceler using the MI will detect a very weak geomagnetism and thus will determine the direction more accurately.

Example 6

Powders of Fe, Co, Ni, Zr, Nb and B were mixed such that the mixture has a composition by molar ratio of $Fe_{56}Co_7Ni_7Zr_6Nb_4B_{20}$. The mixture was melted in a microwave induction furnace in an argon atmosphere with a reduced pressure to form an ingot. The ingot was melted in a crucible, and the melt was sprayed onto a rotating roll through a crucible nozzle in an argon atmosphere with a reduced pressure to quench the melt (single roll process). A ribbon having a thickness of 20 μm was prepared. A sample having a length of 6 mm, a width of 0.1 to 0.2 mm and a thickness of 20 μm as a MI element of Example 6 was prepared from the ribbon.

The MI element was assembled into the magnetic sensing circuit shown in FIG. 13. An alternating current of 3 MHz was applied, while an external magnetic field Hex is applied to the MI element in the longitudinal direction. Output voltages (mV) were measured for various external magnetic fields Hex (Oe).

Figure 27:
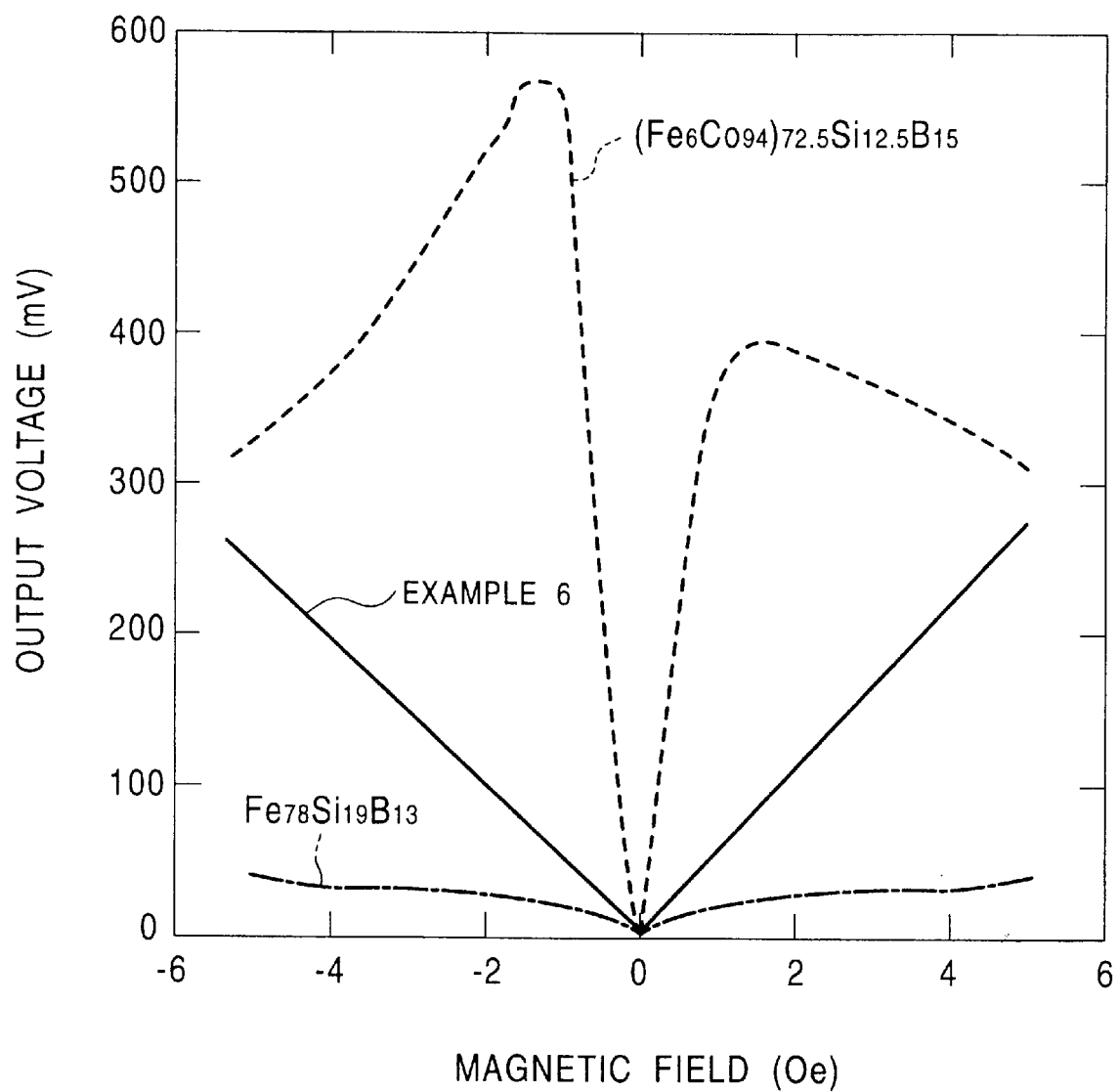
FIG. 27 is a graph illustrating the relationship between the external magnetic field and the output voltage in the MI element of Example 6 and a conventional MI element.
Figure 28A:
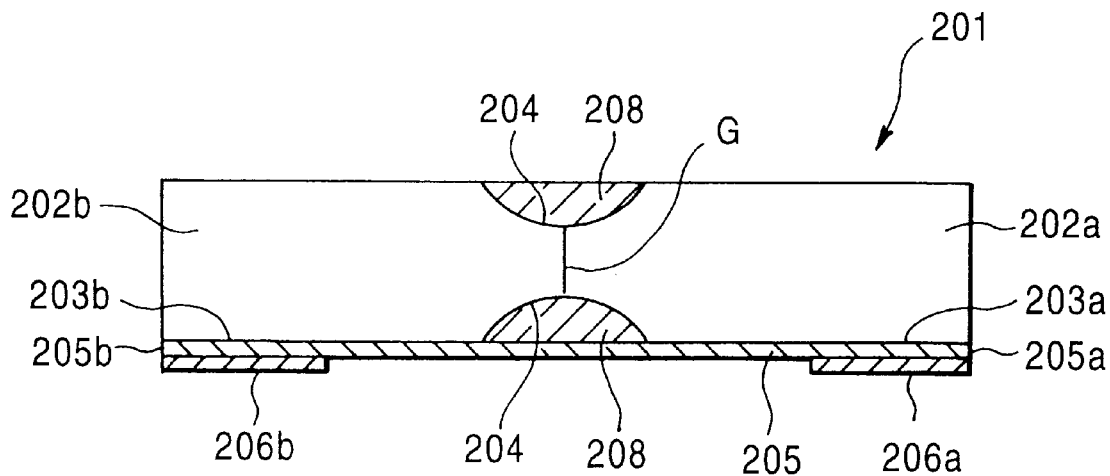
FIGS. 28A and 28B are a plan view and a front view, respectively, of a conventional magnetic head.
Figure 28B:
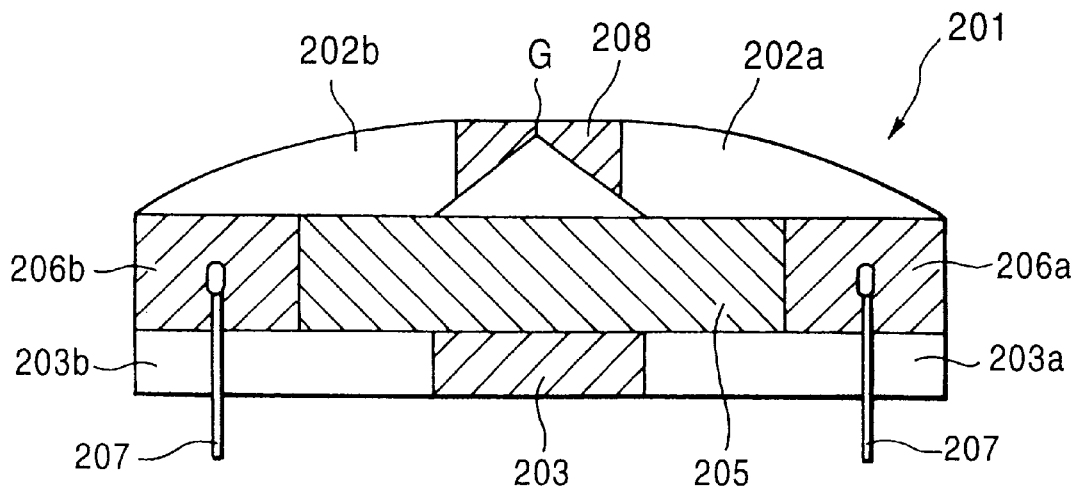

FIG. 27 shows the relationships between the output voltage (mV) and the external magnetic field Hex (Oe) of the MI element of Example 6, conventional MI elements having compositions of $Fe_{78}Si_{19}B_{13}$ and $(Fe_6Co_{94})_{72.5}Si_{12.5}B_{15}$.

The magnetic sensing circuit shown in FIG. 13 consists of high-frequency electrical power source section A, an external magnetic field detecting section B, and an amplification section C. The MI element is assembled in the external magnetic field detecting section B. The high-frequency electrical power source section A generates a high-frequency alternating current and supply to the external magnetic field detecting section B. Any type of high-frequency electrical power source section A can be used. In this Example, it includes a stabilized Colpitts oscillator. The self-oscillation system may be sensitive to the external magnetic field by magnetic modulation, such as amplitude modulation (AM), frequency modulation (FM) or a phase modulation (PM).

The external magnetic field detecting section B includes the MI element Mi and a demodulation circuit. The MI element, which is in a waiting sate by a high-frequency alternating current from the high-frequency power source section A, causes a change in impedance in response to the external magnetic field (Hex). A demodulation circuit demodulates such a change to transmit the demodulated signal to the amplification section C.

The amplification section C includes a differential amplification circuit and output terminals. The output terminals extracts the output voltage (mV) from the MI element.

FIG. 26 illustrates that the MI element of Example 6 has high output voltages with excellent linearity over the very weak magnetic field region of −4 Oe to +4 Oe. The MI element has prominent quantitative characteristics.

Since the MI element can be used as a magnetic sensing means of a magnetic head with a low amplification of output signal, the output signal has high quality. Further, the MI element having excellent linearity in a very weak magnetic field region can operate for a small biasing magnetization.

FIG. 27 demonstrates that the MI element of Example 6 has a higher output voltage compared to the conventional MI element of the composition $Fe_{78}Si_{19}B_{13}$. Since the MI element of Example 6 has a more moderate increase in the output voltage than that of the MI element of the composition $(Fe_6Co_{94})_{72.5}Si_{12.5}B_{15}$ within a very weak magnetic field of −2 Oe to +2 Oe, it has excellent quantitative characteristics. Further, it having a highly symmetrical change in the output current can simplify the circuit configuration of the magnetic head.

Since the MI element can be used as an azimuth sensor which can detect a very weak magnetic field such as geomagnetism and can simplify the circuit configuration for determining the orientation of an external magnetic field from the output voltage formed in the MI element by the external magnetic field. Further, since the MI element can operate for a small biasing magnetization of approximately 2 Oe as an absolute value, the biasing circuit can be simplified.

FIG. 27 demonstrates that the MI element of Example 6 has a higher output voltage compared to the conventional MI element of the composition $Fe_{78}Si_{19}B_{13}$, and thus has high sensitivity to an external magnetic field. Since the MI element of Example 6 has a more moderate increase in the output voltage than that of the MI element of the composition $(Fe_6Co_{94})_{72.5}Si_{12.5}B_{15}$ within a very weak magnetic field of −2 Oe to +2 Oe, it has excellent quantitative characteristics, resulting in a simplified circuit configuration of the azimuth sensor.

Since the MI element can be used as an autocanceler which can detect a very weak magnetic field such as geomagnetism and can simplify the circuit configuration for determining the orientation of an external magnetic field from the output voltage formed in the MI element by the external magnetic field. Further, since the MI element can operate for a small biasing magnetization of approximately 2 Oe as an absolute value, the biasing circuit can be simplified.

FIG. 27 demonstrates that the MI element of Example 6 has a higher output voltage compared to the conventional MI element of the composition $Fe_{78}Si_{19}B_{13}$, and thus has high sensitivity to an external magnetic field. Since the MI element of Example 6 has a more moderate increase in the output voltage than that of the MI element of the composition $(Fe_6Co_{94})_{72.5}Si_{12.5}B_{15}$ within a very weak magnetic field of −2 Oe to +2 Oe, it has excellent quantitative characteristics, resulting in a simplified circuit configuration of the magnetic sensor.

Example 7

A composite was formed on an $Al_2O_3$—TiC (altic) substrate, which has been generally used in sliders for magnetic heads, using a plurality of targets in a radio-frequency magnetron sputtering system and subjected to etching to form a MI element shown in FIG. 12. A thin film MI element composed of $Fe_{56}Co_7Ni_7Zr_6Nb_4B_{20}$ with a thickness of 100 Å, and a ferromagnetic thin film composed of a $Ni_{80}Fe_{20}$ alloy with a thickness of 100 Å, an antiferromagnetic layer of $Pt_{50}Mn_{50}$ with a thickness of 200 Å, and an electrode layer with a thickness of 1,000 Å were deposited in that order by sputtering. The electrode film and the antiferromagnetic film were removed at a place corresponding to the track width (Tw=2 $\mu$m) by photolithography and ion milling.

The resulting MI element was assembled into the magnetic sensing circuit shown in FIG. 13. An alternating current of 3 MHz was applied, while an external magnetic field Hex is applied to the MI element in the longitudinal direction (X direction in FIG. 12). Output voltages (mV) were measured for various external magnetic fields Hex (Oe). The external magnetic field Hex was continuously changed from 0 Oe to 5 Oe, 0 Oe, −5 Oe and then 0 Oe. Amplification was ten times. The results are substantially the same as that shown in FIG. 26. The MI element shows high linearity over a magnetic field region of −5 Oe to +5 Oe, and high sensitivity and quantitative characteristics over a very weak magnetic field region of −2 Oe to +2 Oe.

The magnetic characteristics of the glassy metal alloys were measured. These glassy metal alloys are used as an upper core and a lower core of a thin film magnetic head having a cross-sectional structure shown in FIGS. 10 and 11. DSC thermograms of thin film glassy alloys having the compositions of $Fe_{60}Co_3Ni_7Zr_{10}B_{20}$, $Fe_{56}Co_7Ni_7Zr_{10}B_{20}$, $Fe_{49}Co_{14}Ni_7Zr_{10}B_{20}$ and $Fe_{46}Co_{17}Ni_7Zr_{10}B_{20}$ are the same as those in FIG. 21.

The ternary diagram showing the dependence of $\Delta T_x$ (=$T_x - T_g$) on the Fe, Co and Ni contents in the composition of $(Fe_{1-a-b}Co_aNi_b)_{70}M_{10}B_{20}$ is the same as that shown in FIG. 23. Thus, $\Delta T_x$ is larger than 25° C. over the entire range of the composition of $(Fe_{1-a-b}Co_aNi_b)_{70}M_{10}B_{20}$. The compositions having larger Fe contents have higher $\Delta T_x$. In order to achieve a $\Delta T_x$ of 60° C. or more, 3 atomic percent or more and 20 atomic percent or less of Co, and 3 atomic percent or more and 30 atomic percent or less of Ni are contained.

In the composition of $(Fe_{1-a-b}Co_aNi_b)_{70}M_{10}B_{20}$, the suffix a representing the Co ratio is 0.042 or more for a Co content of 3 atomic percent or more, and 0.29 or less for a Co content of 20 atomic percent or less, since $(Fe_{1-a-b}Co_aNi_b)$ is 70 atomic percent. Similarly, the suffix b representing the Ni ratio is 0.042 or more for a Ni content of 3 atomic percent or more, and 0.43 or less for a No content of 30 atomic percent or less.

Quenched alloy ribbons having compositions of $Fe_{56}Co_7Ni_7Zr_{10-x}Nb_xB_{20}$ (x=0, 2, 4, 6, 8, and 10 atomic percent) and the alloy ribbons annealed at 527° C. (800 K) for 5 minutes have substantially the same saturation magnetic flux density, coercive force and the permeability at 1 kHz of the as-quenched alloy ribbons as those shown in FIG. 25. The ribbons not containing Nb have a saturation magnetic flux density of 0.9 (T) or more, whereas the ribbons containing 2 atomic percent of Nb have a saturation magnetic flux density of approximately 0.75 (T). The permeability ($\mu e$) of the as-quenched alloys decreases with an increased Nb percent, that is, 5,031 for Nb=0 atomic percent, 2,228 for Nb=2 atomic percent, or 906 for Nb=10 atomic percent. The permeability of the annealed alloys significantly improve, that is, approximately 2,500 for Nb=2 atomic percent.

The coercive force of the as-quenched alloys is significantly low, that is, 5 A/m (=0.0625 Oe) for Nb=0 and 2 atomic percent, but is significantly increased, that is, 50 A/m (=0.625 Oe) for Nb$\leq$24 atomic percent. In contrast, the annealed alloys have excellent coercive force regardless of the Nb content.

The glassy alloy in accordance with the present invention has a Vickers hardness in a range of 1,300 to 1,500 Hv.

Accordingly, the above-described glassy alloys and thus the upper and lower cores have high hardness and excellent soft magnetism.

What is claimed is:

1. A magneto-impedance element, showing a change in impedance in response to an external magnetic field when an alternating current is applied, comprising a glassy alloy comprising at least one base metal selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 20° C. or more, said temperature region being represented by the equation $\Delta T_x = T_x - T_g$ wherein $T_x$ is the crystallization temperature and $T_g$ is the glass transition temperature, and wherein said glassy alloy has a composition represented by the following formula and a $\Delta T_x$ of 50° C. or more:

$(Fe_{1-a-b}Co_aNi_b)_{100-x-y-z}M_xB_y$ wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one metal selected from the group consisting of Zr, Nb, Ta, Hf, Mo, Ti and V.

2. A magneto-impedance element according to claim 1, wherein said $\Delta T_x$ is 60° C. or more, and suffixes a and b satisfy $0.042 \leq a \leq 0.29$ and $0.042 \leq b \leq 0.43$, respectively.

3. A magneto-impedance element, showing a change in impedance in response to an external magnetic field when an alternating current is applied, comprising a glassy alloy comprising at least one base metal selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, wherein said glassy alloy has a composition represented by the following formula:

$(Fe_{1-a-b}Co_aNi_b)_{100-x-y-z}M_xB_yT_z$ wherein M is at least one additional metal selected from the group consisting of Zr, Nb, Ta, Hf, Mo, Ti and V; T is at least one additional element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent.

4. A magneto-impedance element according to claim 3, wherein said $\Delta T_x$ is 60° C. or more, and suffixes a and b satisfy $0.042 \leq a \leq 0.29$ and $0.042 \leq b \leq 0.43$, respectively.

5. A magneto-impedance element according to claim 1, wherein said glassy alloy is subjected to heat treatment involving cooling after heating at 427° C. to 627° C.

6. A magneto-impedance element according to claim 3, wherein said glassy alloy is subjected to heat treatment involving cooling after heating at 427° C. to 627° C.

7. A magnetic head comprising a magneto-impedance element comprising a soft magnetic glassy alloy comprising at least one primary component selected from the group consisting of Fe, Co and Ni; at least one component selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, and wherein said soft magnetic glassy alloy has a composition represented by the following formula:

$(Fe_{1-a-b}Co_aNi_b)_{100-x-y-z}M_xB_y$ wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V.

8. A magnetic head according to claim 7, wherein said $\Delta T_x$ is 60° C. or more, and suffixes a and b satisfy $0.042 \leq a \leq 0.29$ and $0.042 \leq b \leq 0.43$, respectively.

9. A magnetic head comprising a magneto-impedance element comprising a soft magnetic glassy alloy comprising at least one primary component selected from the group consisting of Fe, Co and Ni; at least one component selected from the group consisting of Fe, Co and Ni; at least one component selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, wherein said soft magnetic glassy alloy has a composition represented by the following formula:

$(Fe_{1-a-b}Co_aNi_b)_{100-x-y-z}M_xB_yT_z$ wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent.

10. A magnetic head according to claim 9, wherein said $\Delta T_x$ is 60° C. or more, and suffixes a and b satisfy $0.042 \leq a \leq 0.29$ and $0.042 \leq b \leq 0.43$, respectively.

11. A magnetic head comprising a magneto-impedance element comprising a soft magnetic glassy alloy comprising at least one primary component selected from the group consisting of Fe, Co and Ni; at least one component selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, and wherein said soft magnetic glassy alloy has a composition represented by the following formula:

$(Fe_{1-a-b}Co_aNi_b)_{100-x-y-z}M_xB_y$ wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V, further comprising a pair of cores and a bonding glass bonding one face of each of said pair of cores by being interposed between said pair of cores; wherein said magneto-impedance element is arranged over said pair of cores so that an external magnetic field is applied to said magneto-impedance element through said pair of cores.

12. A magnetic head according to claim 11, wherein said pair of cores comprise ferrite.

13. A magnetic head according to claim 11, wherein a coil groove is provided between an end and the other end of each of said pair of cores and a recording coil is wound around the coil groove.

14. A magnetic head according to claim 7, wherein said magneto-impedance element is provided with a biasing means.

15. A magnetic head according to claim 11, wherein said magneto-impedance element is provided with a biasing means.

16. A magnetic head according to claim 13, wherein said magneto-impedance element is provided with a biasing means, and said biasing means comprises a biasing coil wound around said coil groove.

17. A magnetic head according to claim 14, wherein said biasing means comprises a permanent magnet provided at the end of said magneto-impedance element.

18. A magnetic head according to claim 15, wherein said biasing means comprises a permanent magnet provided at the end of said magneto-impedance element.

19. A thin film magnetic head comprising a thin film magneto-impedance element, provided for detecting an external magnetic field and showing a change in impedance in response to the external magnetic field when an alternating current is applied, comprising a glassy alloy having a temperature region $\Delta T_x$ of the supercooling liquid zone of 50° C. or more, said temperature region being represented by the equation $\Delta T_x=T_x-T_g$ wherein $T_x$ is the crystallization temperature and $T_g$ is the glass transition temperature, said glassy alloy comprising at least one primary component selected from the group consisting of Fe, Co and Ni; at least one component selected from the group consisting of Zr, Nb, Ta, Hf, Mo, Ti and V; and B, wherein said glassy alloy has a composition represented by the following formula:

$$(Fe_{1-a-b}Co_aNi_b)_{100-x-y-z}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V.

20. A thin film magnetic head according to claim 19, wherein said $\Delta T_x$ is 60° C. or more, and suffixes a and b satisfy $0.042 \leq a \leq 0.29$ and $0.042 \leq b \leq 0.43$, respectively.

21. A thin film magnetic head comprising a thin film magneto-impedance element, provided for detecting an external magnetic field and showing a change in impedance in response to the external magnetic field when an alternating current is applied, comprising a glassy alloy having a temperature region $\Delta T_x$ of the supercooling liquid zone of 50° C. or more, said temperature region being represented by the equation $\Delta T_x=T_x-T_g$ wherein $T_x$ is the crystallization temperature and $T_g$ is the glass transition temperature, said glassy alloy comprising at least one primary component selected from the group consisting of Fe, Co and Ni; at least one component selected from the group consisting of Zr, Nb, Ta, Hf, Mo, Ti and V; and B, wherein said glassy alloy has a composition represented by the following formula:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent.

22. A thin film magnetic head according to claim 21, wherein said $\Delta T_x$ is 60° C. or more, and suffixes a and b satisfy $0.042 \leq a \leq 0.29$ and $0.042 \leq b \leq 0.43$, respectively.

23. A thin film magnetic head comprising a thin film magneto-impedance element, provided for detecting an external magnetic field and showing a change in impedance in response to the external magnetic field when an alternating current is applied, comprising a glassy alloy having a temperature region $\Delta T_x$ of the supercooling liquid zone of 50° C. or more, said temperature region being represented by the equation $\Delta T_x=T_x-T_g$ wherein $T_x$ is the crystallization temperature and $T_g$ is the glass transition temperature, said glassy alloy comprising at least one primary component selected from the group consisting of Fe, Co and Ni; at least one component selected from the group consisting of Zr, Nb, Ta, Hf, Mo, Ti and V; and B, wherein said glassy alloy has a composition represented by the following formula:

$$(Fe_{1-a-b}Co_aNi_b)_{100-x-y-z}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V, wherein said thin film magnetic head has a magnetic induction-type structure comprising a writing head and a reading head provided on a slider in which its medium-facing side moves relative to a magnetic medium, said writing head has a magnetic gap and a coil lead interposed between a thin film upper core and a thin film lower core, and said reading head has a magneto-impedance element and an electrode film connected to the magneto-impedance element.

24. A thin film magnetic head according to claim 19, wherein said thin film magneto-impedance element has a biasing means.

25. A thin film magnetic head according to claim 23, wherein said thin film magneto-impedance element has a biasing means.

26. A thin film magnetic head according to claim 24, wherein said biasing means comprises a permanent magnet connected to said thin film magneto-impedance element.

27. A thin film magnetic head according to claim 25, wherein said biasing means comprises a permanent magnet connected to said thin film magneto-impedance element.

28. A thin film magnetic head according to claim 24, wherein said biasing means comprises a ferromagnetic thin film deposited on said thin film magneto-impedance element, and an antiferromagnetic thin film deposited on said ferromagnetic thin film, and the bias is applied by an exchange coupling magnetic field induced in said ferromagnetic thin film by said antiferromagnetic thin film.

29. A thin film magnetic head according to claim 25, wherein said biasing means comprises a ferromagnetic thin film deposited on said thin film magneto-impedance element, and an antiferromagnetic thin film deposited on said ferromagnetic thin film, and the bias is applied by an exchange coupling magnetic field induced in said ferromagnetic thin film by said antiferromagnetic thin film.

30. An azimuth sensor comprising a magneto-impedance element as a sensing means of the direction of a magnetic flux of an external magnetic field, said magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x=T_x-T_g$ wherein $T_x$ is the crystallization temperature and $T_g$ is the glass transition temperature, wherein said glassy alloy has a composition represented by the following formula:

$$(Fe_{1-a-b}Co_aNi_b)_{100-x-y-z}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V.

31. An azimuth sensor according to claim 30, wherein said $\Delta T_x$ is 60° C. or more, and suffixes a and b satisfy $0.042 \leq a \leq 0.29$ and $0.042 \leq b \leq 0.43$, respectively.

32. An azimuth sensor comprising a magneto-impedance element as a sensing means of the direction of a magnetic flux of an external magnetic field, said magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, and wherein said soft magnetic glassy alloy has a composition represented by the following formula:

$$(Fe_{1-a-b}CO_aNi_b)_{100-x-y-z}M_xB_yT_z$$

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $< z \leq 5$ atomic percent.

33. An azimuth sensor according to claim 32, wherein said $\Delta T_x$ is 60° C. or more, and suffixes a and b satisfy $0.042 \leq a \leq 0.29$ and $0.042 \leq b \leq 0.43$, respectively.

34. An azimuth sensor comprising:
a magneto-impedance element as a sensing means of the direction of a magnetic flux of an external magnetic field, said magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, wherein said glassy alloy has a composition represented by the following formula:

$$(Fe_{1-a-b}CO_aNi_b)_{100-x-y-z}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V;
a first magneto-impedance element as a sensing means of an X-axis component of said magnetic flux of the external magnetic field; and
a second magneto-impedance element as a sensing means of a Y-axis component of said magnetic flux.

35. An azimuth sensor according to claim 34, wherein said first and second magneto-impedance elements are arranged in the same plane so that the current paths of alternating currents applied to these elements are perpendicular to each other.

36. An azimuth sensor according to claim 35, wherein a coil for applying a bias magnetization along the current path of the alternating current is wound around each of said first and second magneto-impedance elements.

37. An autocanceler comprising a canceling coil for applying a canceling magnetic field having the reverse vector to the magnetic flux of an external magnetic field to a CRT tube, and a control unit for controlling the vector of the canceling magnetic field based on the direction of the magnetic flux of said external field detected by a magnetic sensor;
wherein said magnetic sensor as a sensing means of the external magnetic field comprises a magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$, wherein $T_x$ is the crystallization temperature and $T_g$ is the glass transition temperature, wherein said glassy alloy has a composition represented by the following formula:

$$(Fe_{1-a-b}CO_aNi_b)_{100-x-y-z}M_xB_y$$

wherein $0 \leq a \leq 0.29$, $0 \leq b \leq 0.43$, 5 atomic percent $\leq x \leq 20$ atomic percent, 10 atomic percent $\leq y \leq 22$ atomic percent, and M is at least one element selected from the group consisting of Zr, Nb, Ta, Hf, Mo, Ti and V.

38. An autocanceler according to claim 37, wherein said $\Delta T_x$ is 60° C. or more, and suffixes a and b satisfy $0.042 \leq a \leq 0.29$ and $0.042 \leq b \leq 0.43$, respectively.

39. An autocanceler comprising a canceling coil for applying a canceling magnetic field having the reverse vector to the magnetic flux of an external magnetic field to a CRT tube, and a control unit for controlling the vector of the canceling magnetic field based on the direction of the magnetic flux of said external field detected by a magnetic sensor;
wherein said magnetic sensor as a sensing means of the external magnetic field comprises a magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$, wherein $T_x$ is the crystallization temperature and $T_g$ is the glass transition temperature, and wherein said soft magnetic glassy alloy has a composition represented by the following formula:

$$(Fe_{1-a-b}CO_aNi_b)_{100-x-y-z}M_xB_yT_z$$

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $< z \leq 5$ atomic percent.

40. An autocanceler according to claim 32, wherein said $\Delta T_x$ is 60° C. or more, and suffixes a and b satisfy $0.042 \leq a \leq 0.29$ and $0.042 \leq b \leq 0.43$, respectively.

41. An autocanceler comprising a canceling coil for applying a canceling magnetic field having the reverse vector to the magnetic flux of an external magnetic field to a CRT tube, and a control unit for controlling the vector of the canceling magnetic field based on the direction of the magnetic flux of said external field detected by a magnetic sensor;
wherein said magnetic sensor as a sensing means of the external magnetic field comprises a magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 20° C. or more, said temperature region being represented by the equation $\Delta T_x=T_x-T_g$, wherein $T_x$ is the crystallization temperature and $T_g$ is the glass transition temperature, and a first magneto-impedance element as a sensing means of an X-axis component of said magnetic flux of the external magnetic field; and a second magneto-impedance element as a sensing means of a Y-axis component of said magnetic flux.

42. An autocanceler comprising a canceling coil for applying a canceling magnetic field having the reverse vector to the magnetic flux of an external magnetic field to a CRT tube, and a control unit for controlling the vector of the canceling magnetic field based on the direction of the magnetic flux of said external field detected by a magnetic sensor;

wherein said magnetic sensor as a sensing means of the external magnetic field comprises a magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x=T_x-T_g$, wherein $T_x$ is the crystallization temperature and $T_g$ is the glass transition temperature, and wherein said soft magnetic glassy alloy has a composition represented by the following formula:

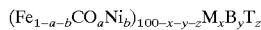

$(Fe_{1-a-b}Co_aNi_b)_{100-x-y-z}M_xB_yT_z$ wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $<z \leq 5$ atomic percent; and a first magneto-impedance element as a sensing means of an X-axis component of said magnetic flux of the external magnetic field; and a second magneto-impedance element as a sensing means of a Y-axis component of said magnetic flux.

43. An autocanceler according to claim 42, wherein said first and second magneto-impedance elements are arranged in the same plane so that the current paths of alternating currents applied to these elements are perpendicular to each other.

44. An autocanceler according to claim 43, wherein a coil for applying a bias magnetization along the current path of the alternating current is wound around each of said first and second magneto-impedance elements.

45. A magnetic head according to claim 9, wherein said magneto-impedance element is provided with a biasing means.

46. A magnetic head according to claim 45, wherein said biasing means comprises a permanent magnet provided at the end of said magneto-impedance unit.

47. A magnetic head comprising a magneto-impedance element comprising a soft magnetic glassy alloy comprising at least one primary component selected from the group consisting of Fe, Co and Ni; at least one component selected from the group consisting of Zr, Nb, Ta, Hf, Mo, Ti and V; and B; and having a temperature region $\Delta T_x$ of the supercooling liquid zone of 20° C. or more, said temperature region being represented by the equation $\Delta T_x=T_x-T_g$ wherein $T_x$ is the crystallization temperature and $T_g$ is the glass transition temperature, wherein said soft magnetic glassy alloy has a composition represented by the following formula and a $\Delta T_x$ of 50° C. or more:

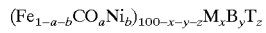

$(Fe_{1-a-b}Co_aNi_b)_{100-x-y-z}M_xB_yT_z$ wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent, and further comprising a pair of cores and a bonding glass bonding one face of each of said pair of cores by being interposed between said pair of cores; wherein said magneto-impedance element is arranged over said pair of cores so that an external magnetic field is applied to said magneto-impedance element through said pair of cores.

48. A magnetic head according to claim 47, wherein said pair of cores comprises ferrite.

49. A magnetic head according to claim 47, wherein a coil groove is provided between an end and the other end of each of said pair of cores and a recording coil is wound around the coil groove.

50. A magnetic head according to claim 47, wherein said magneto-impedance element is provided with a biasing means.

51. A magnetic head according to claim 49, wherein said magneto-impedance element is provided with a biasing means, and said biasing means comprises a biasing coil wound around said coil groove.

52. A magnetic head according to claim 50, wherein said biasing means comprises a permanent magnet provided at the end of said magneto-impedance element.

53. A thin film magnetic head according to claim 21, wherein said thin film magneto-impedance element has a biasing means.

54. A thin film magnetic head according to claim 53, wherein said biasing means comprises a permanent magnet connected to said thin film magneto-impedance element.

55. A thin film magnetic head according to claim 53, wherein said biasing means comprises a ferromagnetic thin film deposited on said thin film magneto-impedance element, and an antiferromagnetic thin film deposited on said ferromagnetic thin film, and the bias is applied by an exchange coupling magnetic field induced in said ferromagnetic thin film by said antiferromagetic thin film.

56. A thin film magnetic head according to claim 23, wherein said $\Delta T_x$ is 60° C. or more, and suffixes a and b satisfy $0.042 \leq a \leq 0.29$ and $0.042 \leq b \leq 0.43$, respectively.

57. A thin film magnetic head comprising a thin film magneto-impedance element, provided for detecting an external magnetic field and showing a change in impedance in response to the external magnetic field when an alternating current is applied, comprising a glassy alloy having a temperature region $\Delta T_x$ of the supercooling liquid zone of 50° C. or more, said temperature region being represented by the equation $\Delta T_x=T_x-T_g$ wherein $T_x$ is the crystallization temperature and $T_g$ is the glass transition temperature, said glassy alloy comprising at least one primary component selected from the group consisting of Fe, Co and Ni; at least one component selected from the group consisting of Zr, Nb, Ta, Hf, Mo, Ti and V; and B, wherein said glassy alloy has a composition represented by the following formula:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $\leq z \leq 5$ atomic percent, and further wherein said thin film magnetic head has a magnetic induction-type structure comprising a writing head and a reading head provided on a slider in which its medium-facing side moves relative to a magnetic medium, said writing head has a magnetic gap and a coil lead interposed between a thin film upper core and a thin film lower core, and said reading head has a magneto-impedance element and an electrode film connected to the magneto-impedance element.

58. A thin film magnetic head according to claim 57, wherein said $\Delta T_x$ is 60° C. or more, and suffixes a and b satisfy $0.042 \leq a \leq 0.29$ and $0.042 \leq b \leq 0.43$, respectively.

59. A thin film magnetic head according to claim 57, wherein said thin film magneto-impedance element has a biasing means.

60. A thin film magnetic head according to claim 59, wherein said biasing means comprises a permanent magnet connected to said thin film magneto-impedance element.

61. A thin film magnetic head according to claim 59, wherein said biasing means comprises a ferromagnetic thin film deposited on said thin film magneto-impedance element, and an antiferromagnetic thin film deposited on said ferromagnetic thin film, and the bias is applied by an exchange coupling magnetic field induced in said ferromagnetic thin film by said antiferromagetic thin film.

62. An azimuth sensor according to claim 34, wherein said $\Delta T_x$ is 60° C. or more, and suffixes a and b satisfy $0.042 \leq a \leq 0.29$ and $0.042 \leq b \leq 0.43$, respectively.

63. An azimuth sensor comprising a magneto-impedance element as a sensing means of the direction of a magnetic flux of an external magnetic field, said magneto-impedance element comprising a soft magnetic glassy alloy comprising at least one primary component selected from the group consisting of Fe, Co and Ni; at least one additional metal selected from the group consisting of Zr, Nb, Ta, Hf, Mo, Ti and V; and B; and having a temperature region $\Delta T_x$ of the supercooling liquid zone of 50° C. or more, said temperature region being represented by the equation $\Delta T_x = T_x - T_g$ wherein $T_x$ is the crystallization temperature and $T_g$ is the glass transition temperature, and wherein said soft magnetic glassy alloy has a composition represented by the following formula:

$$(Fe_{1-a-b}Co_aNi_b)_{100-x-y-z}M_xB_yT_z$$

wherein M is at least one additional metal selected from the group consisting of Zr, Nb, Ta, Hf, Mo, Ti and V; T is at least one element selected from the group consisting of Cr, W, Ru, Rh, Pd, Os, Ir, Pt, Al, Si, Ge, C and P; and $0 \leq a \leq 0.29$, $0 \leq b \leq 0.43$, 5 atomic percent $\leq x \leq 20$ atomic percent, 10 atomic percent $\leq y \leq 22$ atomic percent, and 0 atomic percent $< z \leq 5$ atomic percent;

a first magneto-impedance element as a sensing means of an X-axis component of said magnetic flux of the external magnetic field; and a second magneto-impedance element as a sensing means of a Y-axis component of said magnetic flux.

64. An azimuth sensor according to claim 63, wherein said $\Delta T_x$ is 60° C. or more, and suffixes a and b satisfy $0.042 \leq a \leq 0.29$ and $0.042 \leq b \leq 0.43$, respectively.

65. An azimuth sensor according to claim 63, wherein said first and second magneto-impedance elements are arranged n the same plane so that the current paths of alternating currents applied to these element are perpendicular to each other.

66. An azimuth sensor according to claim 65, wherein a coil for applying a bias magnetization along the current path of the alternating current is wound around each of said first and second magneto-impedance elements.

67. an autocanceler according to claim 41, wherein said $\Delta T_x$ is 60° C. or more, and suffixes a and b satisfy $0.042 \leq a \leq 0.29$ and $0.042 \leq b \leq 0.43$, respectively.

68. An autocanceler according to claim 42, wherein said $\Delta T_x$ is 60° C. or more, and suffixes a and b satisfy $0.042 \leq a \leq 0.29$ and $0.042 \leq b \leq 0.43$, respectively.

69. An autocanceler according to claim 42, wherein said first and second magneto-impedance elements are arranged in the same plane so that the current paths of alternating currents applied to those element are perpendicular to each other.

70. An autocanceler according to claim 69, wherein a coil for applying a bias magnetization along the current path of the alternating current is wound around each of said first and second magneto-impedance elements.

* * * * *

UNITED STATES PATENT AND TRADEMARK OFFICE
CERTIFICATE OF CORRECTION

PATENT NO.    : 6,183,889 B1
DATED         : February 6, 2001
INVENTOR(S)   : Hisato Koshiba et al.

It is certified that error appears in the above-identified patent and that said Letters Patent is hereby corrected as shown below:

<u>Title page,</u>
Item [56] References Cited: under "FOREIGN PATENT DOCUMENTS", delete "8330645 6/1995 (JP)" (entire line).

<u>Column 33,</u>
Lines 64-65, delete "Fe, Co and Ni; at least one component selected from the group consisting of" (duplicate).

<u>Column 37,</u>
Line 15, delete "$<z\leqq5$" and substitute -- $\leqq z\leqq5$ -- in its place.

<u>Column 38,</u>
Line 49, delete "$<z\leqq5$" and substitute -- $\leqq z\leqq5$ -- in its place.

<u>Column 39,</u>
Line 41, delete "$<z\leqq5$" and substitute -- $\leqq z\leqq5$ -- in its place.

<u>Column 42,</u>
Line 15, delete "$<z\leqq5$" and substitute -- $\leqq z\leqq5$ -- in its place.

Line 26, after "arranged" delete "n" and substitute -- in -- in its place.
Line 42, delete "element" and substitute -- elements -- in its place.

Signed and Sealed this

Fourteenth Day of May, 2002

*Attest:*

JAMES E. ROGAN
*Attesting Officer*          *Director of the United States Patent and Trademark Office*